(12) United States Patent  
Kawashima et al.

(10) Patent No.: US 11,335,708 B2  
(45) Date of Patent: May 17, 2022

(54) DISPLAY DEVICE HAVING A PLURALITY OF THIN FILM TRANSISTORS PER PIXEL

(71) Applicant: SEMICONDUCTOR ENERGY LABORATORY CO., LTD., Atsugi (JP)

(72) Inventors: Susumu Kawashima, Kanagawa (JP); Naoto Kusumoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 48 days.

(21) Appl. No.: 16/760,521

(22) PCT Filed: Nov. 15, 2018

(86) PCT No.: PCT/IB2018/058983  
§ 371 (c)(1),  
(2) Date: Apr. 30, 2020

(87) PCT Pub. No.: WO2019/102315  
PCT Pub. Date: May 31, 2019

(65) Prior Publication Data  
US 2021/0210517 A1    Jul. 8, 2021

(30) Foreign Application Priority Data  
Nov. 23, 2017 (JP) .............................. JP2017-225270

(51) Int. Cl.  
*H01L 27/12* (2006.01)  
*G02F 1/1362* (2006.01)  
(Continued)

(52) U.S. Cl.  
CPC ........ *H01L 27/1225* (2013.01); *G02F 1/1368* (2013.01); *G02F 1/136286* (2013.01);  
(Continued)

(58) Field of Classification Search  
CPC .......................... G02F 1/1368; G02F 1/136286  
See application file for complete search history.

(56) References Cited

U.S. PATENT DOCUMENTS 8,860,108 B2    10/2014   Yamazaki et al.  
2009/0243498 A1   10/2009   Childs et al.  
(Continued)

FOREIGN PATENT DOCUMENTS

CN    001833268 A    9/2006  
CN    101743583 A    6/2010  
(Continued)

OTHER PUBLICATIONS

International Search Report (Application No. PCT/IB2018/058983) dated Mar. 5, 2019.  
(Continued)

*Primary Examiner* — Lauren Nguyen  
(74) *Attorney, Agent, or Firm* — Fish & Richardson P.C.

(57) ABSTRACT

A display device capable of improving image quality is provided. A storage node is provided in each pixel and first data can be held in the storage node. Second data is added to the first data by capacitive coupling, which can be supplied to a display element. Thus, the display device can display a corrected image. A reference potential for the capacitive coupling operation is supplied from a power supply line or the like, and thus the first data and the second data can be supplied from a common signal line.

14 Claims, 23 Drawing Sheets

(51) Int. Cl.
*G02F 1/1368* (2006.01)
*H01L 27/32* (2006.01)
*H01L 29/24* (2006.01)
*H01L 29/786* (2006.01)
*G09G 3/3233* (2016.01)
*G09G 3/36* (2006.01)

(52) U.S. Cl.
CPC ........ *H01L 27/124* (2013.01); *H01L 27/1255* (2013.01); *H01L 27/323* (2013.01); *H01L 27/3262* (2013.01); *H01L 27/3265* (2013.01); *H01L 27/3276* (2013.01); *H01L 29/24* (2013.01); *H01L 29/7869* (2013.01); *H01L 29/78648* (2013.01); *G09G 3/3233* (2013.01); *G09G 3/3648* (2013.01); *G09G 2300/0426* (2013.01); *G09G 2300/0852* (2013.01)

(56) References Cited

U.S. PATENT DOCUMENTS

| | | | |
|---|---|---|---|
| 2010/0109985 | A1 | 5/2010 | Ono |
| 2011/0074762 | A1* | 3/2011 | Shirasaki ............. G09G 3/3291 345/211 |
| 2011/0316897 | A1 | 12/2011 | Teranishi |
| 2013/0020567 | A1* | 1/2013 | Lee .................... H01L 29/7869 257/43 |
| 2013/0249883 | A1 | 9/2013 | Hwang |
| 2013/0292671 | A1 | 11/2013 | Yamazaki et al. |
| 2015/0138183 | A1 | 5/2015 | Kishi et al. |
| 2016/0210906 | A1 | 7/2016 | In et al. |
| 2017/0110052 | A1 | 4/2017 | Kuo |

FOREIGN PATENT DOCUMENTS

| | | |
|---|---|---|
| CN | 102034429 A | 4/2011 |
| CN | 102298915 A | 12/2011 |
| CN | 103325810 A | 9/2013 |
| CN | 104064149 A | 9/2014 |
| EP | 1654720 A | 5/2006 |
| EP | 2642476 A | 9/2013 |
| JP | 2007-501953 | 2/2007 |
| JP | 2011-095720 A | 5/2011 |
| JP | 2011-119674 A | 6/2011 |
| JP | 2012-008340 A | 1/2012 |
| JP | 2013-200541 A | 10/2013 |
| KR | 2006-0064614 A | 6/2006 |
| KR | 2010-0036321 A | 4/2010 |
| KR | 2011-0035988 A | 4/2011 |
| KR | 2013-0107677 A | 10/2013 |
| TW | 200511170 | 3/2005 |
| TW | 201120851 | 6/2011 |
| TW | 201211996 | 3/2012 |
| TW | 201340072 | 10/2013 |
| TW | 201409449 | 3/2014 |
| WO | WO-2005/015530 | 2/2005 |
| WO | WO-2009/011092 | 1/2009 |
| WO | WO-2014/021150 | 2/2014 |
| WO | WO-2016/004679 | 1/2016 |

OTHER PUBLICATIONS

Written Opinion (Application No. PCT/IB2018/058983) dated Mar. 5, 2019.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Yamazaki.S et al., "In—Ga—Zn-Oxide Semiconductor and Its Transistor Characteristics", ECS Journal of Solid State Science and Technology, Jul. 1, 2014, vol. 3, No. 9, p. Q3012-Q3022.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology : Digest of Technical Papers, 2015, pp. T216-T217.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Chinese Office Action (Application No. 201880073067.4) dated Dec. 22, 2021.

* cited by examiner

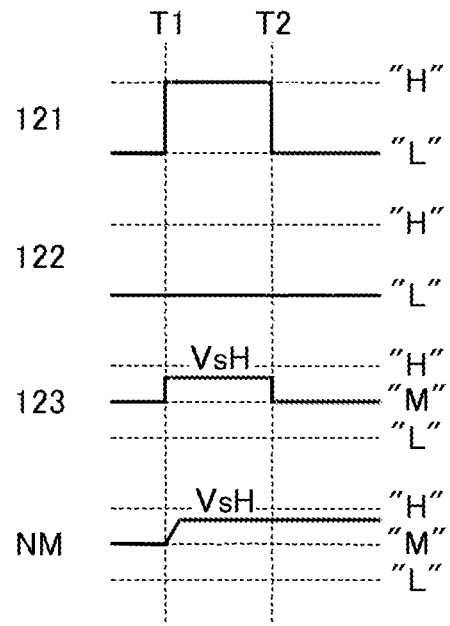
FIG. 8A1
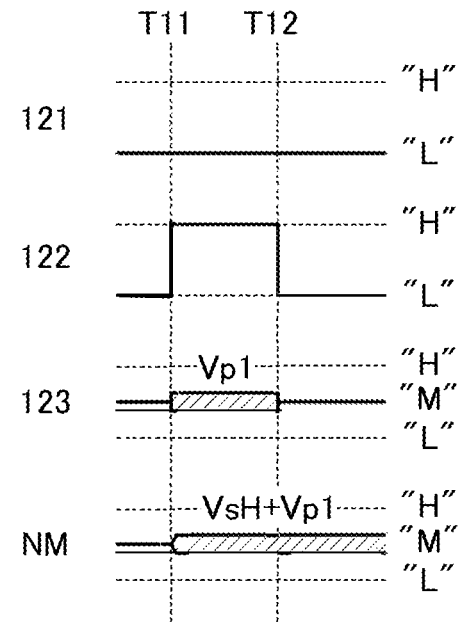
FIG. 8A2
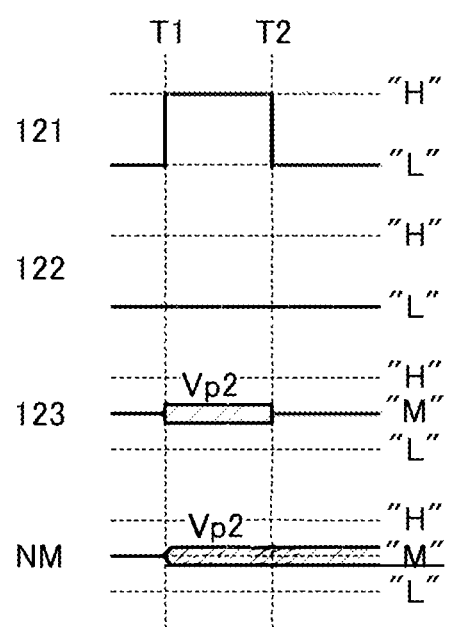
FIG. 8B1
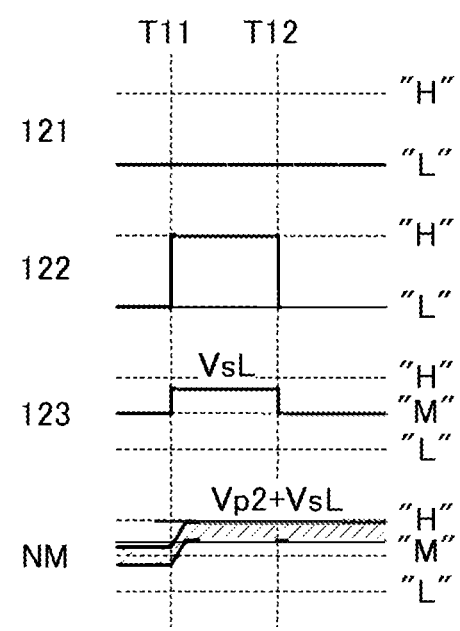
FIG. 8B2

FIG. 9A
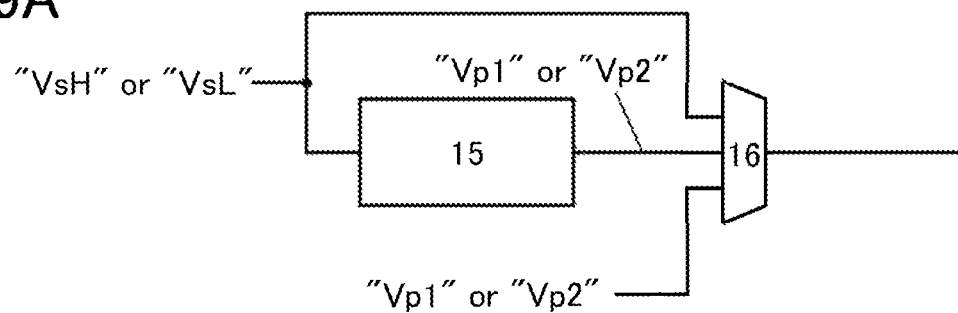
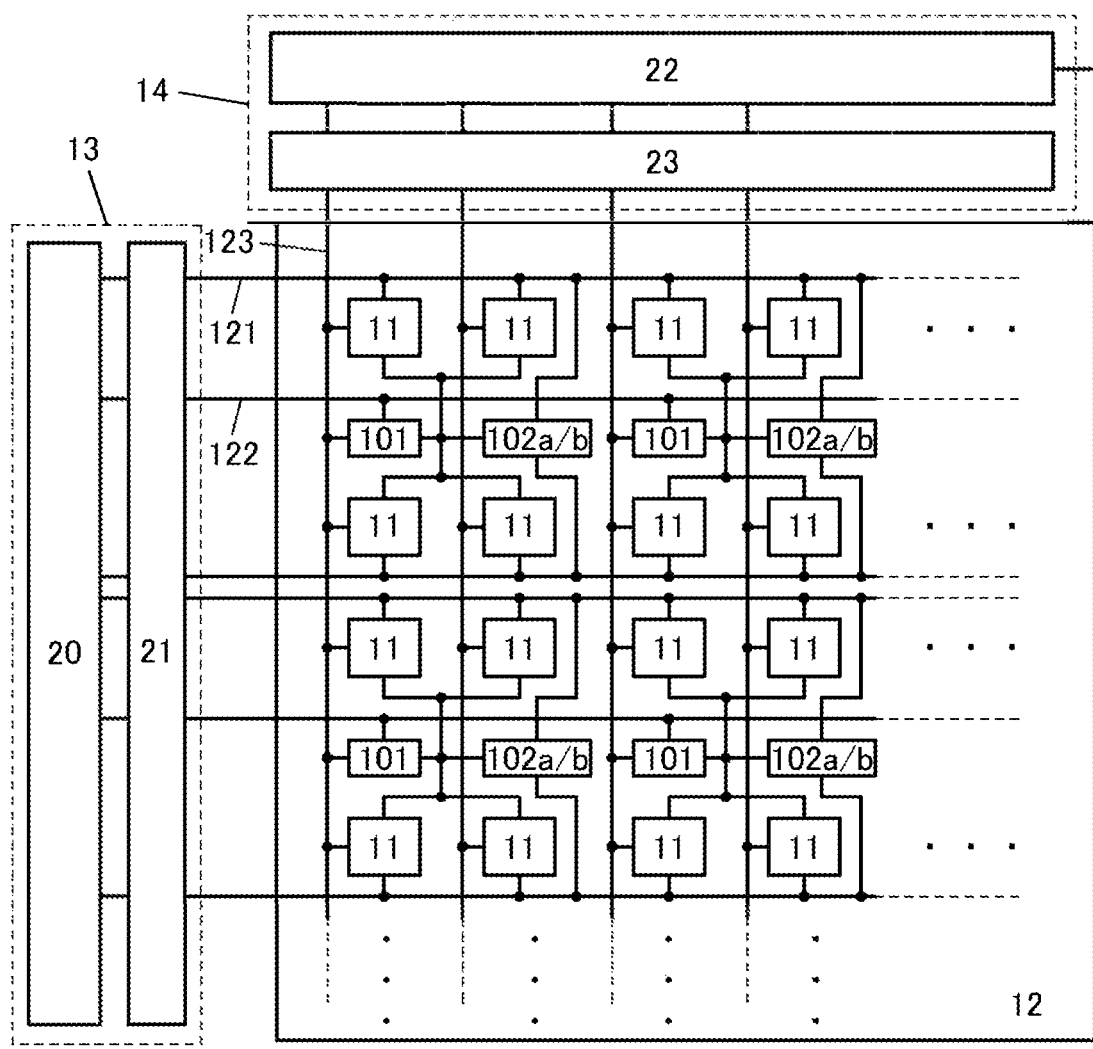
FIG. 9B
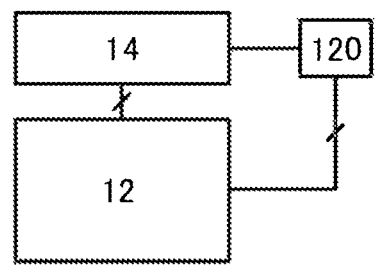
FIG. 9C
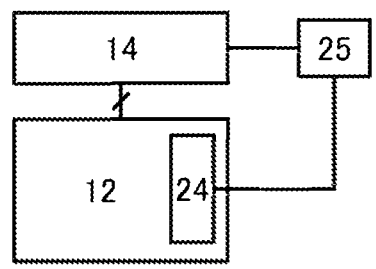

$a = x_1 w_1 + x_2 w_2 + b$

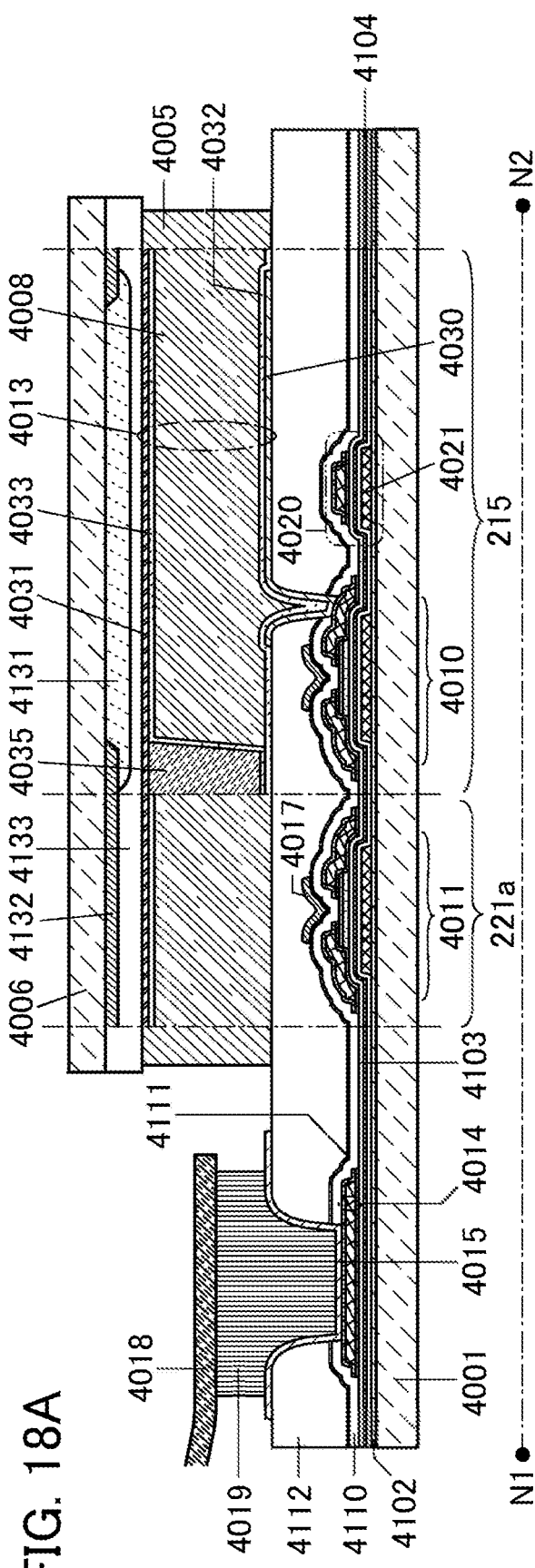

FIG. 19A1
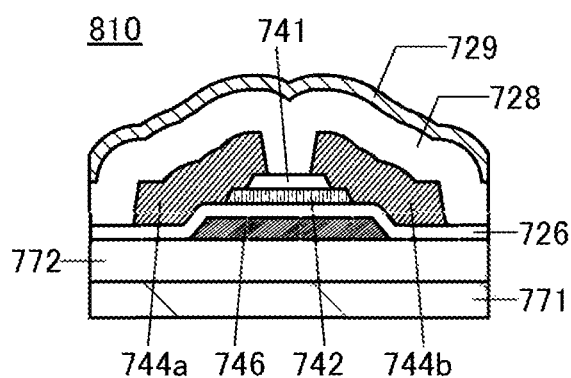
FIG. 19A2
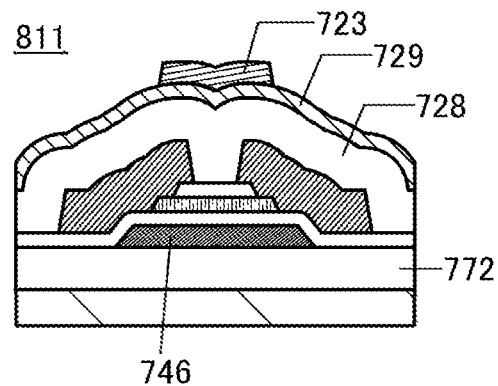
FIG. 19B1
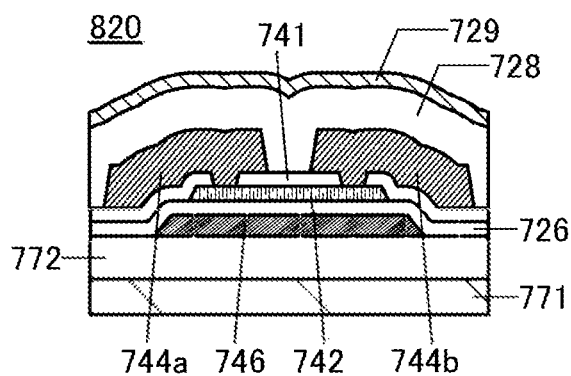
FIG. 19B2
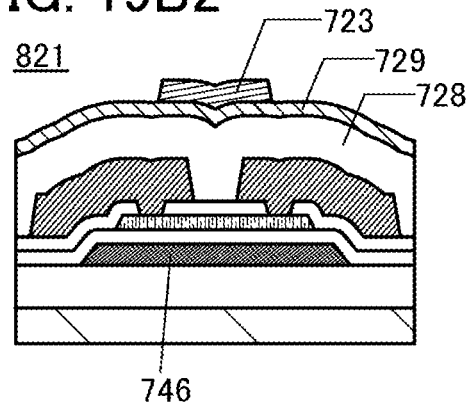
FIG. 19C1
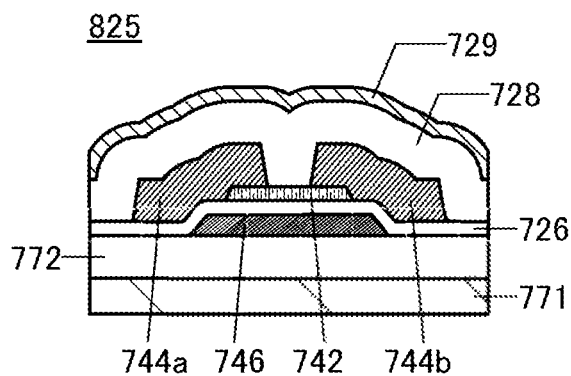
FIG. 19C2
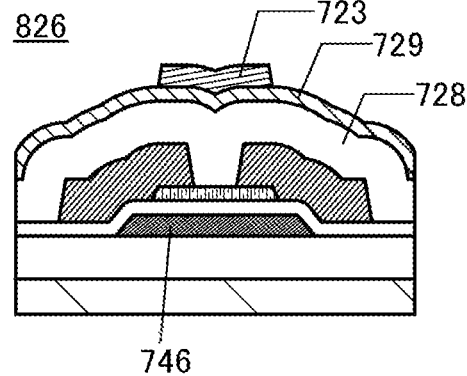

FIG. 20A1
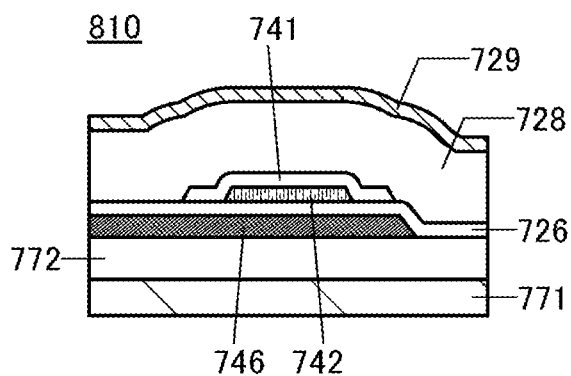
FIG. 20A2
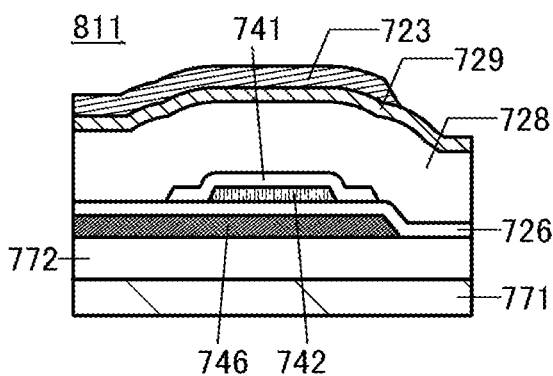
FIG. 20B1
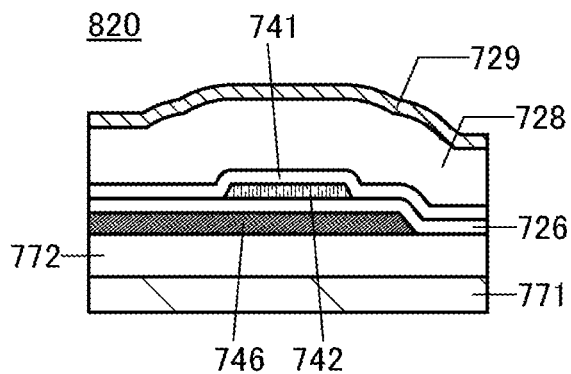
FIG. 20B2
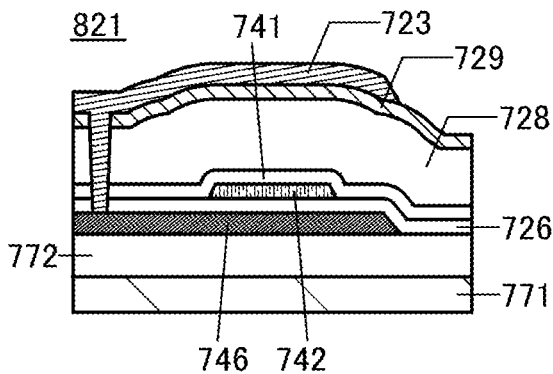
FIG. 20C1
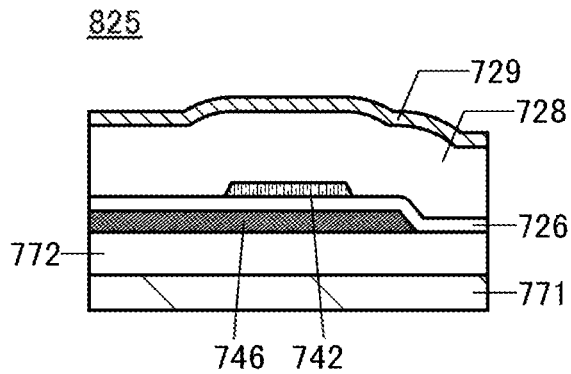
FIG. 20C2
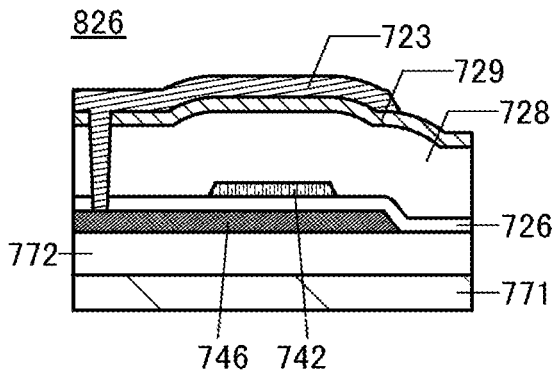

FIG. 21A1
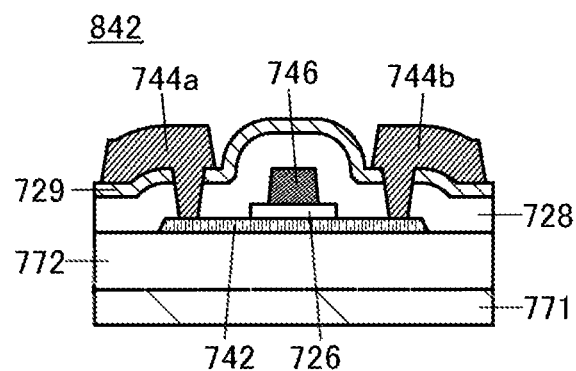
FIG. 21A2
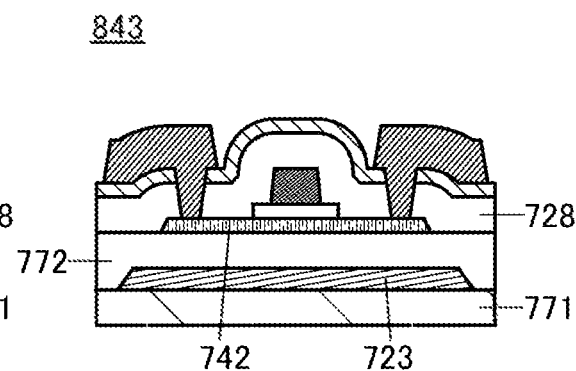
FIG. 21B1
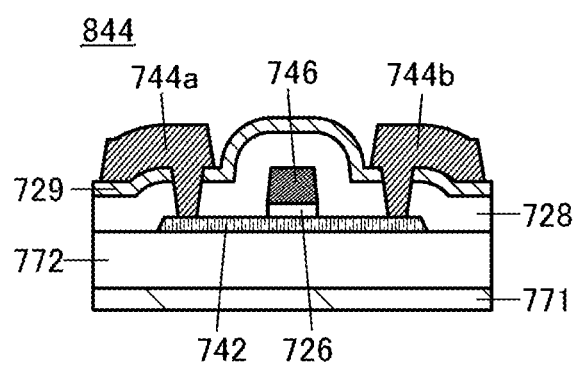
FIG. 21B2
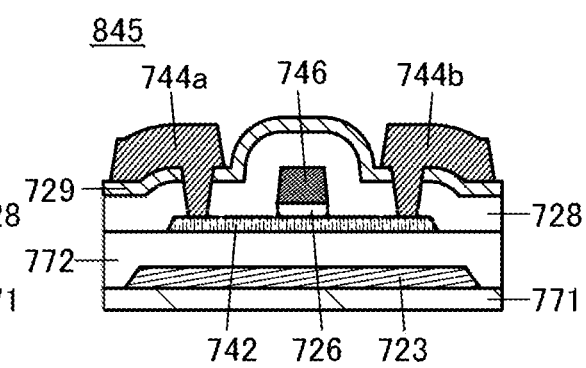
FIG. 21C1
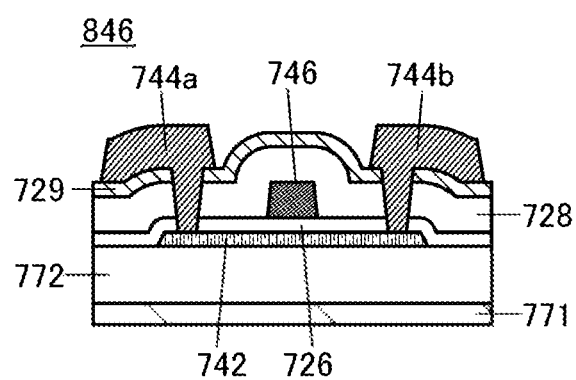
FIG. 21C2
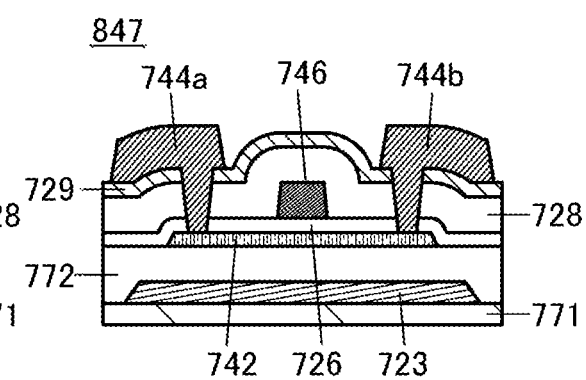

FIG. 22A1
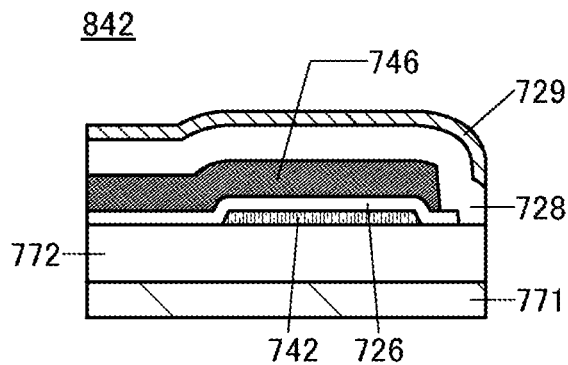
FIG. 22A2
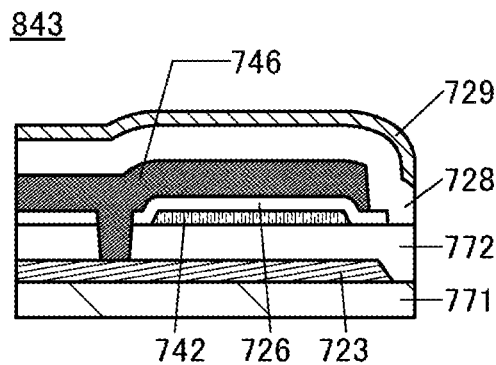
FIG. 22B1
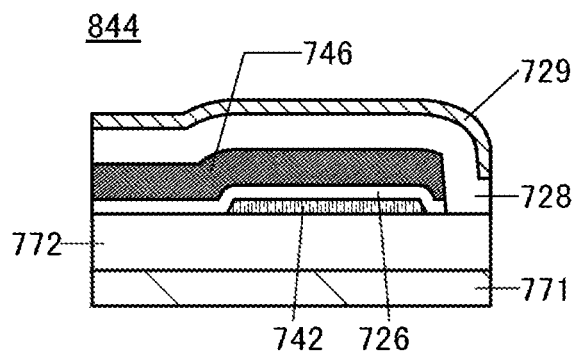
FIG. 22B2
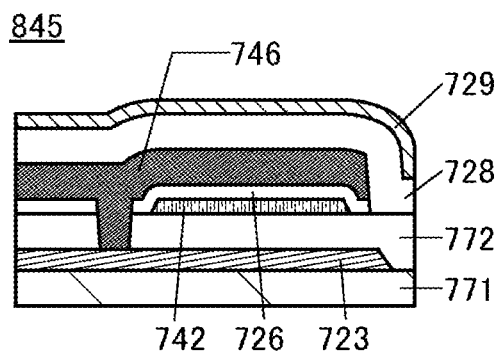
FIG. 22C1
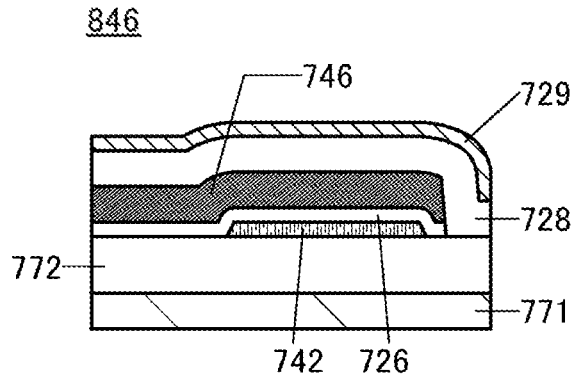
FIG. 22C2
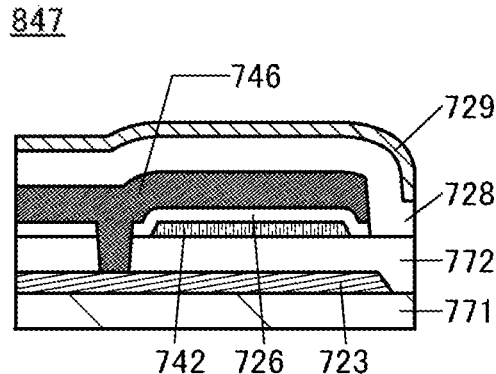

DISPLAY DEVICE HAVING A PLURALITY OF THIN FILM TRANSISTORS PER PIXEL

CROSS REFERENCE TO RELATED APPLICATIONS

This application is a U.S. National Phase Application under 35 U.S.C. § 371 of International Application PCT/IB2018/058983, filed on Nov. 15, 2018, which is incorporated by reference and claims the benefit of a foreign priority application filed in Japan on Nov. 23, 2017, as Application No. 2017-225270.

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

Silicon-based semiconductor materials are widely known as materials for semiconductor thin films which can be used in transistors; oxide semiconductors have been attracting attention as other materials. Examples of oxide semiconductors include not only single-component metal oxides, such as indium oxide and zinc oxide, but also multi-component metal oxides. Among the multi-component metal oxides, in particular, an In-Ga—Zn oxide (hereinafter also referred to as IGZO) has been actively studied.

From the studies on IGZO, in an oxide semiconductor, a c-axis aligned crystalline (CAAC) structure and a nanocrystalline (nc) structure, which are not single crystal nor amorphous, have been found (see Non-Patent Documents 1 to 3). In Non-Patent Documents 1 and 2, a technique for forming a transistor using an oxide semiconductor having the CAAC structure is disclosed. Moreover, Non-Patent Documents 4 and 5 disclose that a fine crystal is included even in an oxide semiconductor which has lower crystallinity than the CAAC structure and the nc structure.

In addition, a transistor which includes IGZO as an active layer has an extremely low off-state current (see Non-Patent Document 6), and an LSI and a display utilizing the characteristics have been reported (see Non-Patent Documents 7 and 8).

Patent Document 1 discloses a memory device using a transistor with an extremely low off-state current in a memory cell.

REFERENCES

Patent Document

[Patent Document 1] Japanese Published Patent Application No. 2011-119674

Non-Patent Documents

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

DISCLOSURE OF INVENTION

The resolution of display devices has been increased; hardware capable of displaying images with an 8K4K resolution (7680×4320 pixels) or a higher resolution has been developed. In addition, the high dynamic range (HDR) display technique, which increases image quality by luminance adjustment, has been introduced.

For the proper display by a display device, image data needs to correspond to the resolution of the display device. In the case where a display device has an 8K4K resolution and the image data corresponds to a 4K2K resolution (3840×2160 pixels), for example, the number of data must be converted by a fourfold increase to provide full-screen display. By contrast, in the case where a display device has a 4K2K resolution and the image data corresponds to an 8K4K resolution, the number of data must be converted into a quarter.

In HDR processing, a dedicated circuit is necessary for generation of image data or conversion of the number of data, which unfortunately increases power consumption. At least the conversion of original image data is preferably omitted when the data is input to pixels in a display device.

Thus, an object of one embodiment of the present invention is to provide a display device capable of improving image quality. Another object is to provide a display device capable of performing the proper display without conversion of image data. Another object is to provide a display device capable of performing HDR display. Another object is to provide a display device capable of performing upconversion operation. Another object is to provide a display device capable of enhancing the luminance of a displayed image. Another object is to provide a display device capable of displaying two images superimposed on each other.

Another object is to provide a low-power display device. Another object is to provide a highly reliable display device. Another object is to provide a novel display device or the like. Another object is to provide a method of driving any of the display devices. Another object is to provide a novel semiconductor device or the like.

Note that the description of these objects does not preclude the existence of other objects. One embodiment of the present invention does not have to achieve all the objects. Other objects will be apparent from and can be derived from the description of the specification, the drawings, the claims, and the like.

One embodiment of the present invention relates to a display device capable of improving image quality. Another embodiment of the present invention relates to a display device capable of performing image processing.

One embodiment of the present invention is a display device including a first transistor, a second transistor, a third transistor, a first capacitor, a circuit block, a first wiring, and a second wiring. One of a source and a drain of the first transistor is electrically connected to one of a source and a drain of the second transistor. The one of the source and the drain of the second transistor is electrically connected to one electrode of the first capacitor. The other electrode of the first capacitor is electrically connected to one of a source and a drain of the third transistor. The one of the source and the drain of the third transistor is electrically connected to the circuit block. The other of the source and the drain of the first transistor is electrically connected to the first wiring. The other of the source and the drain of the third transistor is electrically connected to the first wiring. A gate of the second transistor is electrically connected to the second wiring. A gate of the third transistor is electrically connected to the second wiring. The circuit block includes a display element.

Another embodiment of the present invention is a display device including a first transistor, a second transistor, a first circuit, a second circuit, a first wiring, and a second wiring. The first circuit and the second circuit each include a third transistor, a first capacitor, and a circuit block. One of a source and a drain of the third transistor is electrically connected to one electrode of the first capacitor. The one electrode of the first capacitor is electrically connected to the circuit block. The other electrode of the first capacitor is electrically connected to one of a source and a drain of the first transistor. The one of the source and the drain of the first transistor is electrically connected to one of a source and a drain of the second transistor. The other of the source and the drain of the third transistor in the first circuit is electrically connected to the first wiring. The other of the source and the drain of the first transistor is electrically connected to the first wiring. A gate of the third transistor in the first circuit is electrically connected to the second wiring. A gate of the third transistor in the second circuit is electrically connected to the second wiring. A gate of the second transistor is electrically connected to the second wiring. The circuit block includes a display element.

The circuit block includes a fourth transistor, a fifth transistor, a second capacitor, and an organic EL element as the display element, and can have the following structure. One electrode of the organic EL element is electrically connected to one of a source and a drain of the fifth transistor. The other of the source and the drain of the fifth transistor is electrically connected to one electrode of the second capacitor. The one electrode of the second capacitor is electrically connected to one of a source and a drain of the fourth transistor. A gate of the fourth transistor is electrically connected to the other electrode of the second capacitor. The other electrode of the second capacitor is electrically connected to the one electrode of the first capacitor.

In the above structure, the other of the source and the drain of the fourth transistor can be electrically connected to the other of the source and the drain of the second transistor.

The circuit block includes a sixth transistor, a third capacitor, and a liquid crystal element as the display element, and can have the following structure. One electrode of the liquid crystal element is electrically connected to one electrode of the third capacitor. The one electrode of the third capacitor is electrically connected to one of a source and a drain of the sixth transistor. The other of the source and the drain of the sixth transistor is electrically connected to the one electrode of the first capacitor.

In the above structure, the other electrode of the third capacitor can be electrically connected to the other of the source and the drain of the second transistor.

The third transistor contains a metal oxide in a channel formation region. The metal oxide preferably contains In, Zn, and M, where M is Al, Ti, Ga, Sn, Y, Zr, La, Ce, Nd, or Hf.

According to one embodiment of the present invention, a display device capable of improving image quality can be provided. A display device capable of performing the proper display without conversion of image data can be provided. A display device capable of performing HDR display can be provided. A display device capable of performing an upconversion operation can be provided. A display device capable of enhancing the luminance of a displayed image can be provided. A display device capable of displaying two images superimposed on each other can be provided.

A low-power display device can be provided. A highly reliable display device can be provided. A novel display device or the like can be provided. A method of driving any of the display devices can be provided. A novel semiconductor device or the like can be provided.

BRIEF DESCRIPTION OF DRAWINGS

FIGS. 8A1, 8A2, 8B1, and 8B2 are timing charts showing operations of a pixel array.

FIGS. 9A to 9C are block diagrams showing a display device.

FIGS. 18A and 18B each show a display device.

FIGS. 19A1, 19A2, 19B1, 19B2, 19C1, and 19C2 each show a transistor.

FIGS. 20A1, 20A2, 20B1, 20B2, 20C1, and 20C2 each show a transistor.

FIGS. 21A1, 21A2, 21B1, 21B2, 21C1, and 21C2 each show a transistor.

FIGS. 22A1, 22A2, 22B1, 22B2, 22C1, and 22C2 each show a transistor.

BEST MODE FOR CARRYING OUT THE INVENTION

Figure 1:
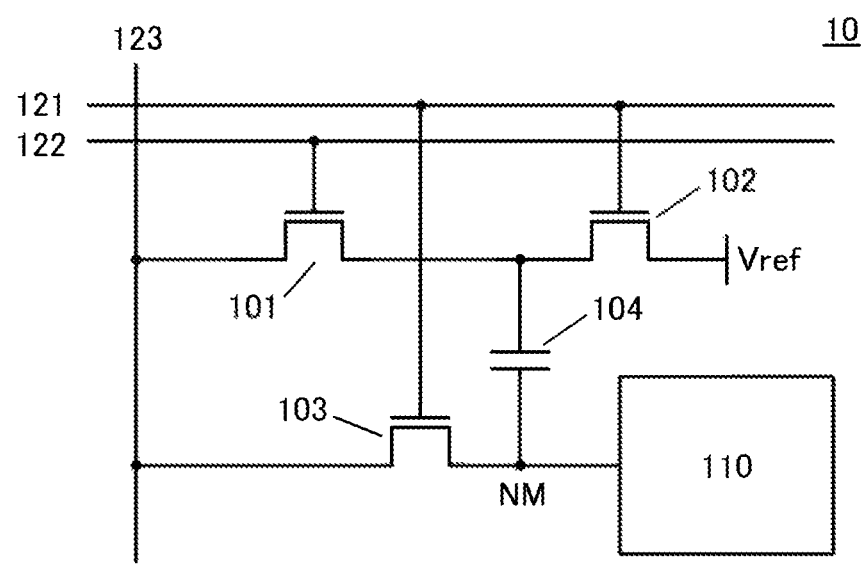
FIG. 1 shows a pixel circuit.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. However, the same components might be denoted by different hatching patterns in different drawings, or the hatching patterns might be omitted.

Embodiment 1

In this embodiment, a display device of one embodiment of the present invention is described with reference to drawings.

One embodiment of the present invention is a display device having a function of correcting image data in pixels. A storage node is provided in each pixel and first data can be held in the storage node. Second data is added to the first data by capacitive coupling, which can be supplied to a display element. Alternatively, the first data can be added by capacitive coupling after the second data is written to the storage node.

Thus, the display device can display a corrected image. Through the correction, image upconversion can be performed. Alternatively, HDR display can be performed by correction of part or the whole of an image in a display portion. Alternatively, the luminance of a displayed image can be significantly improved when the same image data is used as the first data and the second data. Alternatively, arbitrary images superimposed on each other can be displayed when different image data are used as the first data and the second data.

Furthermore, according to one embodiment of the present invention, proper display can be performed without upconversion or downconversion of both image data for high resolution and image data for low resolution. For high-resolution display, individual data is supplied to each pixel through a first transistor included in the pixel. For low-resolution display, the same data is supplied to a plurality of pixels through a second transistor electrically connected to the plurality of pixels.

The image data for high resolution here refers to, for example, data corresponding to 8K4K (7680×4320 pixels). The image data for low resolution refers to, for example, data corresponding to 4K2K (3840×2160 pixels). Thus, it is assumed that the effective ratio (corresponding to the number of effective pixels) of the number of image data for high resolution to that of the image data for low resolution is 4:1.

Note that as long as the ratio between the numbers of data (pixels) is 4:1, the image data for high resolution may be data corresponding to 4K2K and the image data for low resolution may be data corresponding to Full HD (1920× 1080 pixels) without limitation to the above example. Alternatively, the image data for high resolution may be data corresponding to 16K8K (15360×8640) and the image data for low resolution may be data corresponding to 8K4K.

FIG. 1 shows a pixel 10 which can be used for the display device of one embodiment of the present invention. The pixel 10 includes a transistor 101, a transistor 102, a transistor 103, a capacitor 104, and a circuit block 110. The circuit block 110 can include a transistor, a capacitor, a display element, and the like and is described in detail later.

One of a source and a drain of the transistor 101 is electrically connected to one of a source and a drain of the transistor 102. The one of the source and the drain of the transistor 102 is electrically connected to one electrode of the capacitor 104. The other electrode of the capacitor 104 is electrically connected to one of a source and a drain of the transistor 103. The one of the source and the drain of the transistor 103 is electrically connected to the circuit block 110.

Here, a node NM refers to a wiring to which the one of the source and the drain of the transistor 103, the other electrode of the capacitor 104, and the circuit block 110 are connected. Note that the node NM can be floating depending on a component of the circuit block 110 which is connected to the node NM.

A gate of the transistor 101 is electrically connected to a wiring 122. A gate of the transistor 102 and a gate of the transistor 103 are electrically connected to a wiring 121. The other of the source and the drain of the transistor 101 and the other of the source and the drain of the transistor 103 are electrically connected to a wiring 123. The other of the source and the drain of the transistor 102 is electrically connected to a wiring capable of supplying a certain potential "Vref".

The wirings 121 and 122 can each function as a signal line for controlling operation of the transistors. The wiring 123 can function as a signal line supplying the first data or the second data. As the wiring capable of supplying the "Vref", for example, a power supply line electrically connected to a component of the circuit block 110 can be used.

For a capacitive coupling operation described later, "Vref" and the first data (e.g., correction data) need to be supplied to the pixel in the same period. For this reason, if "Vref" is supplied from a signal line, at least a signal line supplying the first data and a signal line supplying "Vref" or the second data (e.g., image data) are needed.

However, in the display device of one embodiment of the present invention, "Vref" is supplied from the power supply line or the like. This allows one signal line (wiring 123) to supply the first data and the second data at different timings. Accordingly, the number of wirings in the display device can be reduced.

The node NM is a storage node. When the transistor 103 is turned on, data supplied to the wiring 123 can be written to the node NM. When the transistor 103 is turned off, the data can be held in the node NM. The use of a transistor with an extremely low off-state current as the transistor 103 allows the potential of the node NM to be held for a long time. As this transistor, a transistor using a metal oxide in a channel formation region (hereinafter referred to as an OS transistor) can be used, for example.

An OS transistor may be used for other transistors in the pixel as well as the transistor 103. A transistor containing Si in a channel formation region (hereinafter referred to as a Si transistor) may be used as the transistor 103. Both an OS transistor and a Si transistor may be used. Examples of a Si transistor include a transistor containing amorphous silicon and a transistor containing crystalline silicon (typically, low-temperature polysilicon and single crystal silicon).

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

An OS transistor has a large energy gap and thus has an extremely low off-state current. An OS transistor has the following feature different from that of a Si transistor: impact ionization, an avalanche breakdown, a short-channel effect, or the like does not occur. Thus, the use of an OS transistor enables formation of a highly reliable circuit.

A semiconductor layer in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor in the semiconductor layer is an In-M-Zn-based oxide, the atomic ratio between metal elements in a sputtering target used to form a film of the In-M-Zn oxide preferably satisfies In≥M and Zn≥M. The atomic ratio between metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio between metal elements in the formed semiconductor layer varies from the above atomic ratio between metal elements in the sputtering target in a range of ±40%.

An oxide semiconductor with low carrier density is used for the semiconductor layer. For example, the semiconductor layer may use an oxide semiconductor whose carrier density is lower than or equal to $1 \times 10^{17}/cm^3$, preferably lower than or equal to $1 \times 10^{15}/cm^3$, more preferably lower than or equal to $1 \times 10^{13}/cm^3$, still more preferably lower than or equal to $1 \times 10^{11}/cm^3$, even more preferably lower than $1 \times 10^{10}/cm^3$, and higher than or equal to $1 \times 10^{-9}/cm^3$. Such an oxide semiconductor is referred to as a highly purified intrinsic or substantially highly purified intrinsic oxide semiconductor. The oxide semiconductor can be said to have a low density of defect states and stable characteristics.

Note that, without limitation to those described above, a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the number of oxygen vacancies is increased in the semiconductor layer, and the semiconductor layer becomes n-type. Thus, the concentration of silicon or carbon (measured by secondary ion mass spectrometry) in the semiconductor layer is set to $2 \times 10^{18}$ atoms/cm$^3$ or lower, preferably $2 \times 10^{17}$ atoms/cm$^3$ or lower.

An alkali metal and an alkaline earth metal might generate carriers when bonded to an oxide semiconductor, in which case the off-state current of the transistor might be increased. Therefore, the concentration of alkali metal or alkaline earth metal in the semiconductor layer (measured by secondary ion mass spectrometry) is set to $1 \times 10^{18}$ atoms/cm$^3$ or lower, preferably $2 \times 10^{16}$ atoms/cm$^3$ or lower.

When the oxide semiconductor in the semiconductor layer contains nitrogen, electrons serving as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (measured by secondary ion mass spectrometry) is preferably set to $5 \times 10^{18}$ atoms/cm$^3$ or lower.

The semiconductor layer may have a non-single-crystal structure, for example.

Examples of a non-single-crystal structure include a CAAC-OS (c-axis aligned crystalline oxide semiconductor) including a c-axis aligned crystal, a polycrystalline structure, a microcrystalline structure, and an amorphous structure. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

Described below is the composition of a cloud-aligned composite oxide semiconductor (CAC-OS), which is one embodiment of a non-single-crystal semiconductor layer.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In-Ga—Zn oxide with the CAC composition (such an In-Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is an arbitrary number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is intentionally not heated, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the XRD measurement that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In-Ga—Zn oxide has a composition in which the regions containing $GaO_{X3}$ as a main component and the regions containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are separated to form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through regions containing $In_{X2}Zn_{Y2}O_{Z2}$ or $InO_{X1}$ as a main component, the conductivity of an oxide semiconductor is generated. Accordingly, when regions containing $In_{X2}Zn_{Y2}O_{Z2}$ or $InO_{X1}$ as a main component are distributed in an oxide semiconductor like a cloud, high field-effect mobility (μ) can be achieved.

By contrast, the insulating property of a region containing $GaO_{X3}$ or the like as a main component is more excellent than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element using a CAC-OS has high reliability. Thus, the CAC-OS is suitably used as a material in a variety of semiconductor devices.

Figure 2A:
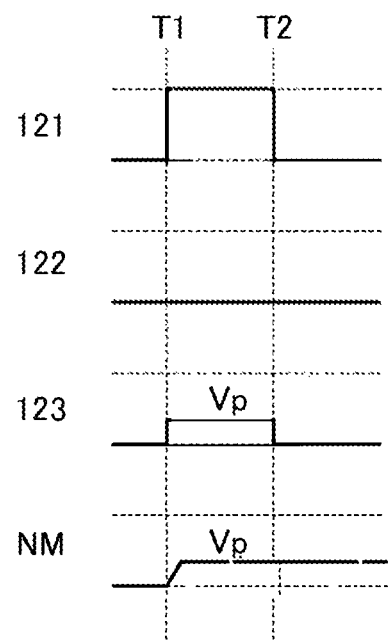
FIGS. 2A and 2B are timing charts showing operations of a pixel circuit.
Figure 2B:
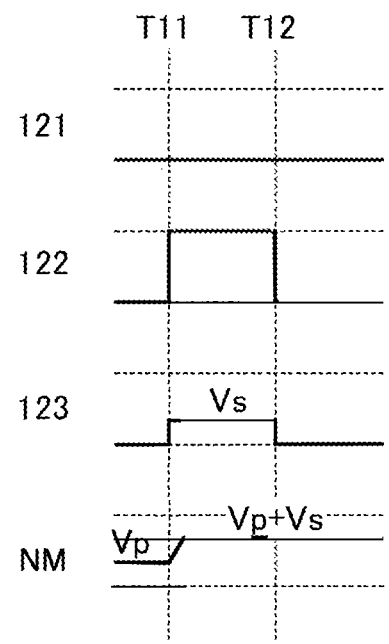

With reference to timing charts shown in FIGS. 2A and 2B, an operation example of the pixel 10 in which the correction data is added to the image data is described. Note that in the following description, "H" represents a high potential, "L" represents a low potential, "Vp" represents the correction data, "Vs" represents the image data, and "Vref" represents the certain potential. As "Vref", for example, 0 V, a GND potential or a certain reference potential can be used. Note that "Vp" and "Vs" can also represent arbitrary first data and arbitrary second data, respectively.

First, the operation of writing the correction data "Vp" into the node NM is described with reference to FIG. 2A. Note that in potential distribution, potential coupling, or potential loss, detailed changes due to a circuit configuration, operation timing, or the like are not considered. A change in potential resulting from capacitive coupling depends on the capacitance ratio of a side that supplies a potential to a side that is supplied with the potential; however, for clarity, the capacitance value of the node NM is assumed to be sufficiently small.

At time T1, the potential of the wiring 121 is set to "H", the potential of the wiring 122 is set to "L", and the potential of the wiring 123 is set to "Vp", so that the transistor 102 is turned on and the potential of the one electrode of the capacitor 104 becomes "Vref". This operation is a reset operation for a later correction operation (capacitive coupling operation).

In addition, the transistor 103 is turned on and the potential of the wiring 123 (correction data "Vp") is written to the node NM.

At time T2, the potential of the wiring 121 is set to "L", the potential of the wiring 122 is set to "L", and the potential of the wiring 123 is set to "L", so that the transistors 102 and 103 are turned off and the correction data "Vp" is held in the node NM. In addition, "Vp−Vref" is held in the capacitor 104.

The operation of writing the correction data "Vp" has been described so far. Note that in the case where the correction is not performed, the same potential as "Vref" is supplied in the above operation as the correction data "Vp".

Next, the operation of correcting the image data "Vs" and a display operation of the display element in the circuit block 110 are described with reference to FIG. 2B.

The operations in FIGS. 2A and 2B can be sequentially performed in one horizontal period. Alternatively, the operations in FIGS. 2A and 2B may be performed in a k-th frame (k is a natural number) and a k+1-th frame, respectively. Alternatively, after the operation in FIG. 2A, the operation in FIG. 2B may be performed more than once.

At time T11, the potential of the wiring 121 is set to "L", the potential of the wiring 122 is set to "H", and the potential of the wiring 123 is set to "Vs", so that the transistor 101 is turned on and the potential "Vs" of the wiring 123 is added to the potential of the node NM by capacitive coupling of the capacitor 104. At this time, the potential of the node NM is "Vp−Vref+Vs". When "Vref" is 0, the potential of the node NM becomes "Vp+Vs".

At time T12, the potential of the wiring 121 is set to "L", the potential of the wiring 122 is set to "L", and the potential of the wiring 123 is set to "L", so that the transistor 103 is turned off and the potential of the node NM is held at "Vp+Vs".

After that, the display element included in the circuit block 110 performs the display operation corresponding to the potential of the node NM. Note that depending on the structure of the circuit block, the display operation might start at time T1 or time T11.

The operation of correcting the image data is described with reference to FIG. 3A.

Figure 3A:
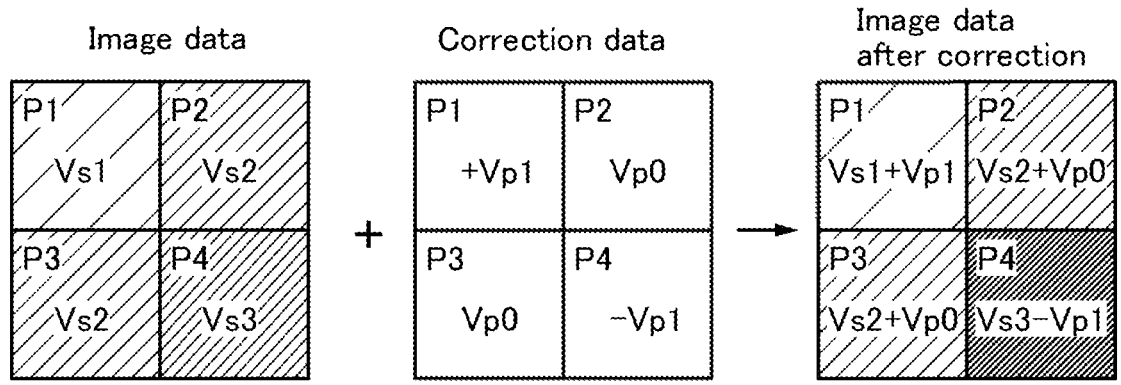
FIGS. 3A and 3B show correction of image data and synthesis of images.

In FIG. 3A, input image data (Vs1, Vs2, and Vs3), input correction data (+Vp1, Vp0, and −Vp1), and generated image data after correction, for four pixels (P1 to P4) in the longitudinal and lateral directions, are shown from the left. Note that in the following description, the display element can perform display such that the luminance becomes high when the potential of the image data is relatively high and the luminance becomes low when the potential of the image data is relatively low.

For example, in the pixel P1, the image data "Vs1" is combined with the positive correction data "+Vp1", making the image data "Vs1+Vp1" and increasing the luminance. In the pixels P2 and P3, the image data Vs2 is combined with the correction data "Vp0" which causes substantially no correction, making the image data "Vs2+Vp0=Vs2" and keeping the luminance unchanged. In the pixel P4, the image data "Vs3" is combined with the negative correction data "−Vp1", making the image data "Vs1−Vp1" and decreasing the luminance.

Such a combination of the image data and the correction data enables, for example, upconversion, HDR display, correction of display unevenness unique to display devices, or correction of the threshold voltage of transistors included in pixels.

In an upconversion operation, the same image data is supplied to all the four pixels, for example. The pixels become capable of displaying different images when correction is performed. For example, data for one certain pixel in a display device that includes pixels corresponding to 4K2K is input to four certain pixels in a display device that includes pixels corresponding to 8K4K, so that display with higher resolution can be performed.

Figure 3B:
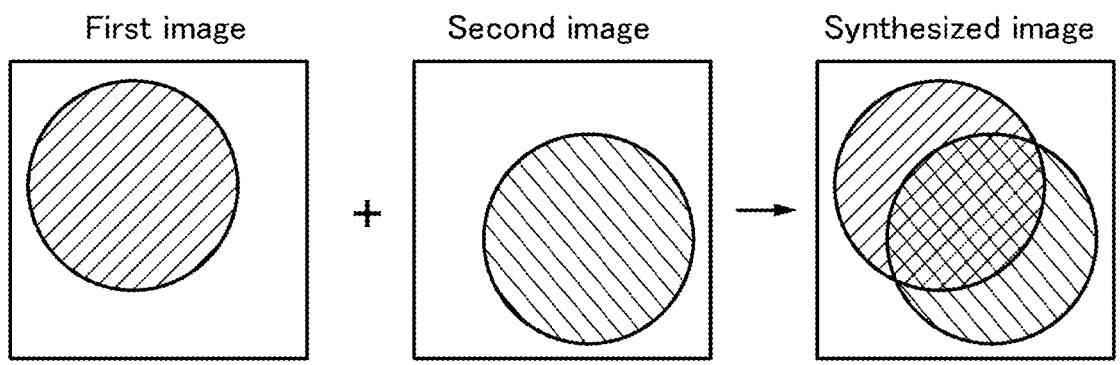

Different images superimposed on each other can be displayed, which is the correction of image data in a broad sense. FIG. 3B shows images of the entire display portion, i.e., a first image composed of the image data "Vs", a second image composed of the correction data "Vp", and an image in which the first image and the second image are synthesized, from the left.

Such a combination of the image data and the correction data enables display of different images synthesized, improvement of the luminance of the entire display portion, or the like. For example, the combination can be applied to insertion of a character, display of augmented reality (AR), or the like.

Figure 4A:
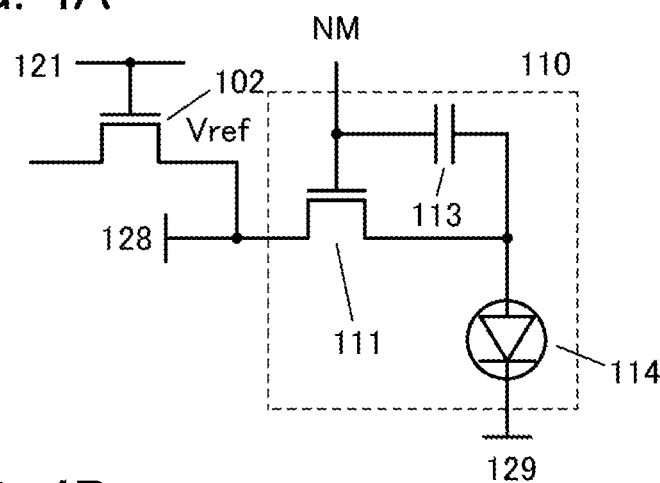
FIGS. 4A to 4C each show a circuit block.
Figure 4B:
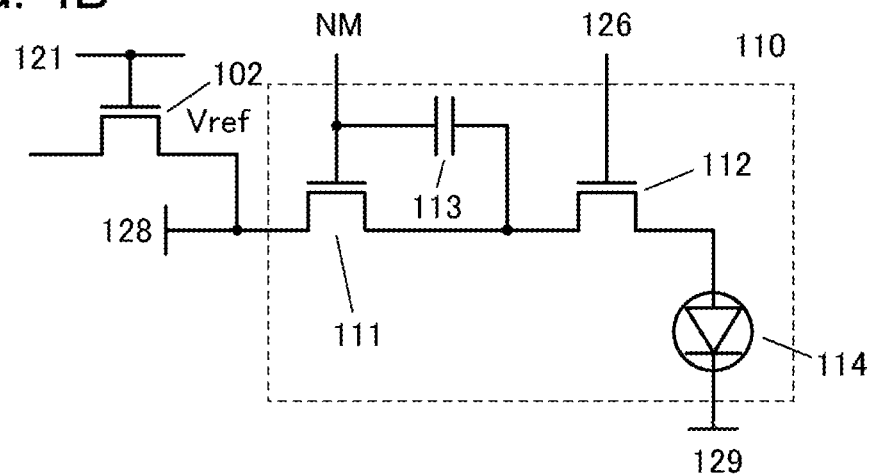
Figure 4C:
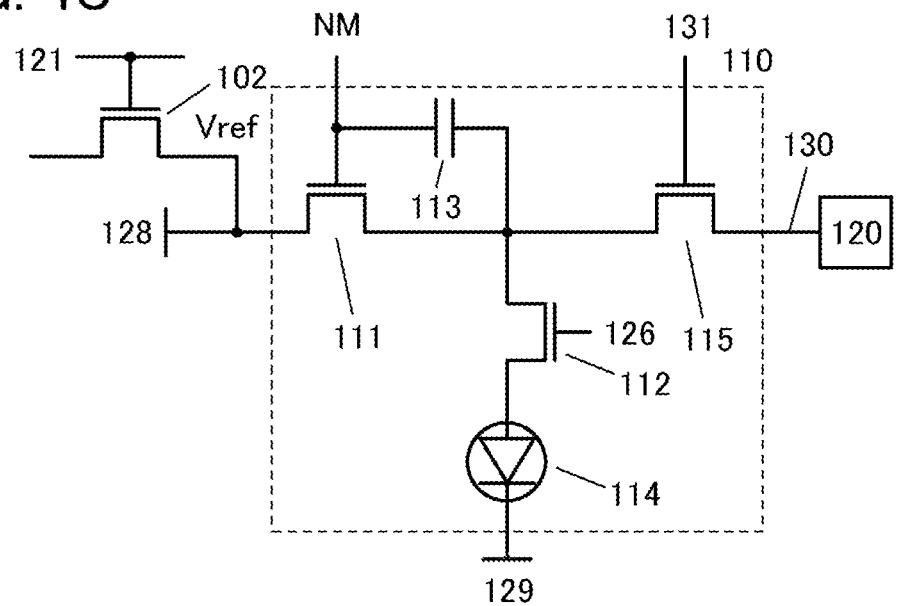

FIGS. 4A to 4C each show an example of a structure including an EL element as the display element, which can be applied to the circuit block 110.

The structure shown in FIG. 4A has a transistor 111, a capacitor 113, and an EL element 114. One of a source and a drain of the transistor 111 is electrically connected to one electrode of the EL element 114. The one electrode of the EL element 114 is electrically connected to one electrode of the capacitor 113. The other electrode of the capacitor 113 is electrically connected to a gate of the transistor 111. The gate of the transistor 111 is electrically connected to the node NM.

The other of the source and the drain of the transistor 111 is electrically connected to a wiring 128. The other electrode of the EL element 114 is electrically connected to a wiring 129. The wirings 128 and 129 have a function of supplying power. For example, the wiring 128 is capable of supplying a high power supply potential. The wiring 129 is capable of supplying a low power supply potential.

Here, the other of the source and the drain of the transistor 103 for supplying "Vref" shown in FIG. 1 can be electrically connected to the wiring 128. Since "Vref" is preferably 0 V, GND, or a low potential, the wiring 128 also has a function of supplying at least any of these potentials. To the wiring 128, "Vref" is supplied when data is written to the node NM or a high power supply potential is supplied when the EL element 114 emits light.

In the structure shown in FIG. 4A, a current flows through the EL element 114 when the potential of the node NM is equal to or exceeds the threshold voltage of the transistor 111. Therefore, in some cases, the EL element 114 starts to emit light at time T1 shown in the timing chart of FIG. 2A; this might limit the applications.

FIG. 4B shows a structure in which a transistor 112 is added to the structure that is shown in FIG. 4A. One of a source and a drain of the transistor 112 is electrically connected to the one of the source and the drain of the transistor 111. The other of the source and the drain of the transistor 112 is electrically connected to the EL element 114. A gate of the transistor 112 is electrically connected to a wiring 126. The wiring 126 can have a function of a signal line controlling the conduction of the transistor 112.

In this structure, a current flows through the EL element 114 when the transistor 112 is turned on and the potential of the node NM is equal to or exceeds the threshold voltage of the transistor 111. Therefore, the EL element 114 can start to emit light at or after time T12 in the timing chart of FIG. 2B; this is suitable for operation involving correction.

FIG. 4C shows a structure in which a transistor 115 is added to the structure that is shown in FIG. 4B. One of a source and a drain of the transistor 115 is electrically connected to the one of the source and the drain of the transistor 111. The other of the source and the drain of the transistor 115 is electrically connected to the wiring 130. A gate of the transistor 115 is electrically connected to a wiring 131. The wiring 131 can have a function of a signal line controlling the conduction of the transistor 115. Note that the gate of the transistor 115 may be electrically connected to the wiring 122.

The wiring 130 can be electrically connected to a supply source of a certain potential such as a reference potential. The certain potential is supplied from the wiring 130 to the one of the source and the drain of the transistor 111, whereby writing of the image data can be stable.

In addition, the wiring 130 can be connected to the circuit 120 and can also function as a monitor line. The circuit 120 can have one or more of the functions of supplying the above certain power supply potential, obtaining electric characteristics of the transistor 111, and generating the correction data.

In the case where the wiring 130 functions as a monitor line, the circuit 120 is capable of generating a potential correcting the threshold voltage of the transistor 111 as the correction data "Vp".

Figure 5A:
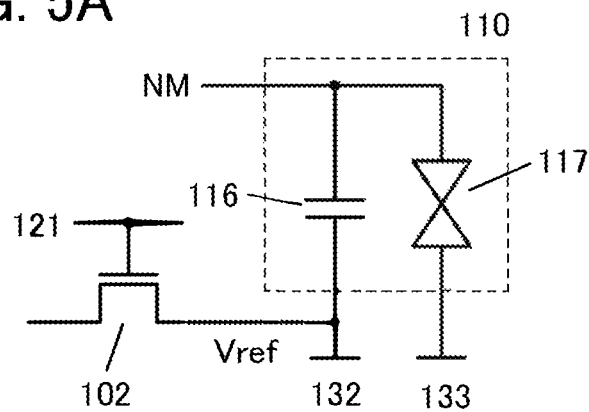
FIGS. 5A to 5C each show a circuit block.
Figure 5B:
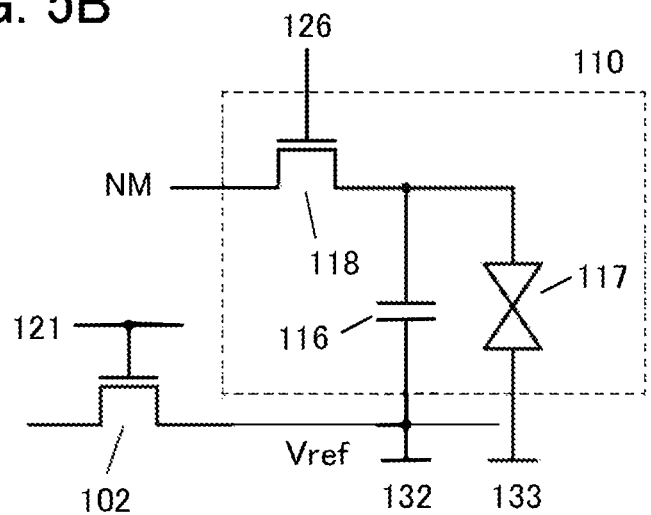
Figure 5C:
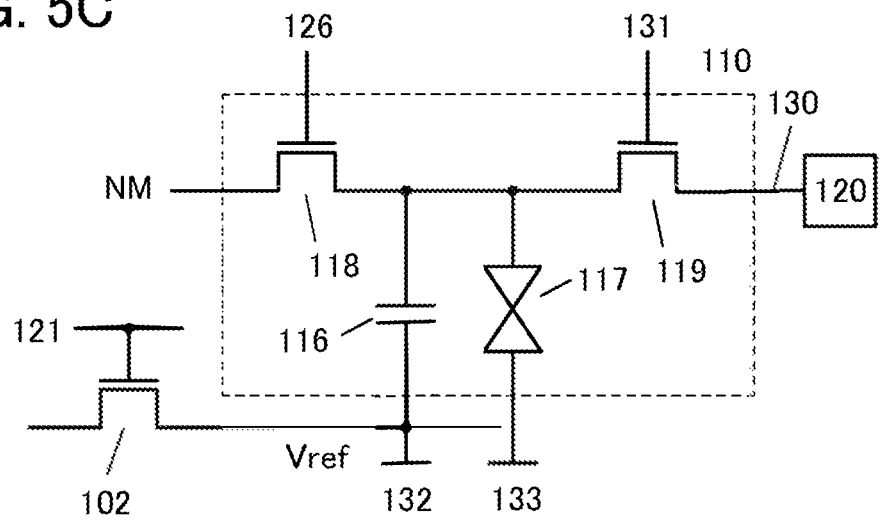

FIGS. 5A to 5C each show an example of a structure including a liquid crystal element as the display element, which can be applied to the circuit block 110.

The structure shown in FIG. 5A has a capacitor 116 and a liquid crystal element 117. One electrode of the liquid crystal element 117 is electrically connected to one electrode of the capacitor 116. The one electrode of the capacitor 116 is electrically connected to the node NM.

The other electrode of the capacitor 116 is electrically connected to a wiring 132. The other electrode of the liquid crystal element 117 is electrically connected to a wiring 133. The wirings 132 and 133 have a function of supplying power. For example, the wirings 132 and 133 are capable of supplying a reference potential such as GND or 0 V or an arbitrary potential.

The other of the source and the drain of the transistor 103 for supplying "Vref" shown in FIG. 1 can be electrically connected to the wiring 132.

In this structure, the operation of the liquid crystal element 117 starts when the potential of the node NM is equal to or exceeds the operation threshold of the liquid crystal element 117. Therefore, in some cases, the display operation starts at time T1 in the timing chart of FIG. 2A, which limits the applications. In a transmissive liquid crystal display device, however, a possible unnecessary display operation can be made less visible when the operation of, for example, turning off a backlight until time T12 in FIG. 2B is combined with this structure.

FIG. 5B shows a structure in which a transistor 118 is added to the structure that is shown in FIG. 5A. One of a source and a drain of the transistor 118 is electrically connected to one electrode of the capacitor 116. The other of the source and the drain of the transistor 118 is electrically connected to the node NM. A gate of the transistor 118 is electrically connected to the wiring 126. The wiring 126 can have a function of a signal line controlling the conduction of the transistor 118.

In this structure, the potential of the node NM is applied to the liquid crystal element 117 when the transistor 118 is turned on. Therefore, the operation of the liquid crystal element can start at or after time T12 shown in the timing chart of FIG. 2B, which is suitable for the operation involving correction.

While the transistor 118 is in an off state, the potentials supplied to the capacitor 116 and the liquid crystal element 117 are held continuously. Before the image data is rewritten, the potentials supplied to the capacitor 116 and the liquid crystal element 117 are preferably reset. For this reset, a reset potential is supplied to the wiring 123 to turn on the transistors 103 and 118 at the same time, for example.

FIG. 5C shows a structure in which a transistor 119 is added to the structure that is shown in FIG. 5B. One of a source and a drain of the transistor 119 is electrically connected to the one electrode of the liquid crystal element 117. The other of the source and the drain of the transistor 119 is electrically connected to the wiring 130. The gate of the transistor 119 is electrically connected to the wiring 131. The wiring 131 can have a function of a signal line controlling the conduction of the transistor 119. Note that the gate of the transistor 119 may be electrically connected to the wiring 122.

The circuit 120 electrically connected to the wiring 130 is as described above using FIG. 4C and also may have the function of resetting the potentials supplied to the capacitor 116 and the liquid crystal element 117.

Figure 6A:
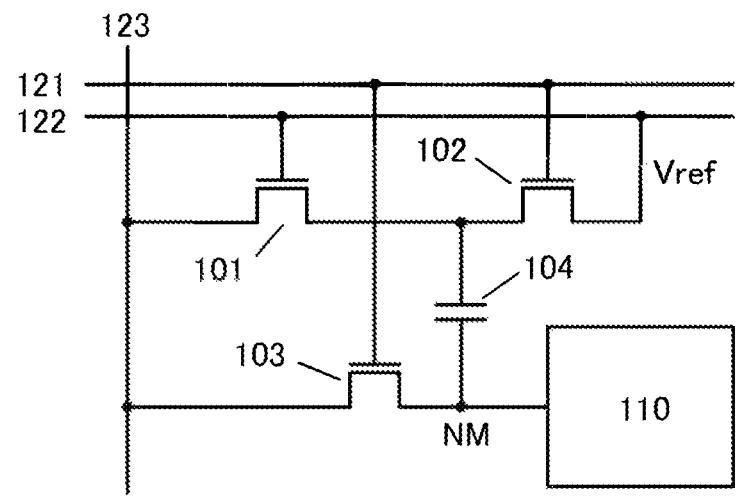
FIGS. 6A to 6C each show a pixel circuit.

Although the examples in which "Vref" is supplied from the power supply line are shown in FIGS. 4A to 4C and FIGS. 5A to 5C, "Vref" can be supplied from a scan line. For example, "Vref" may be supplied from the wiring 122 as shown in FIG. 6A. Since a potential corresponding to "L" is supplied to the wiring 122 when the correction data is written (when the transistor 103 is on), as shown in FIG. 6A, this potential can be used as "Vref".

Figure 6B:
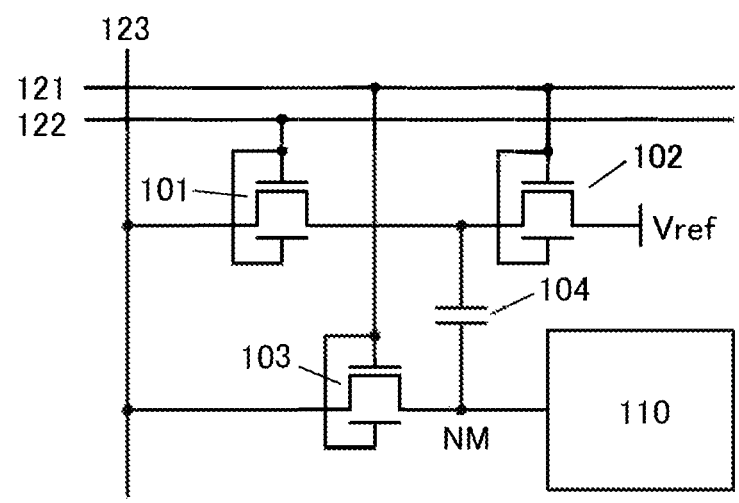
Figure 6C:
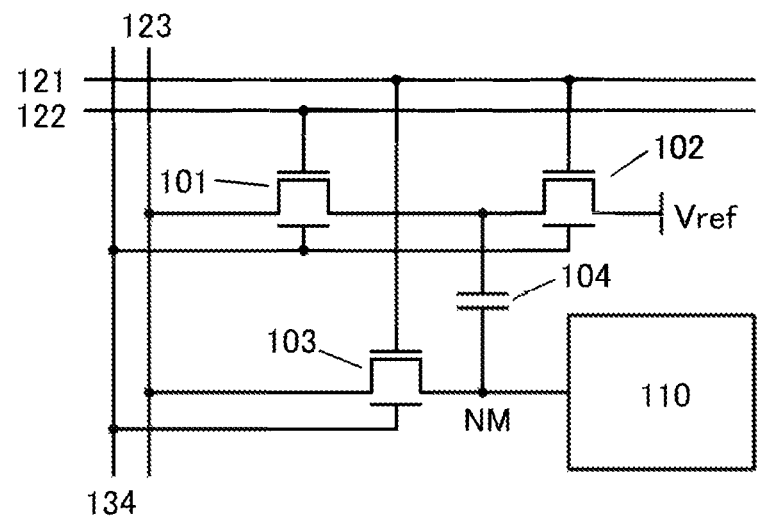

As shown in FIGS. 6B and 6C, the transistors 101, 102, and 103 may each have a back gate. FIG. 6B shows a structure in which the back gates are electrically connected to the respective front gates, which has an effect of increasing on-state currents. FIG. 6C shows a structure in which the back gates are electrically connected to a wiring 134 capable of supplying a constant potential, so that the threshold voltages of the transistors can be controlled. Note that a back gate may also be provided in the transistor included in the circuit block 110 in FIGS. 4A to 4C and FIGS. 5A to 5C.

Figure 7:
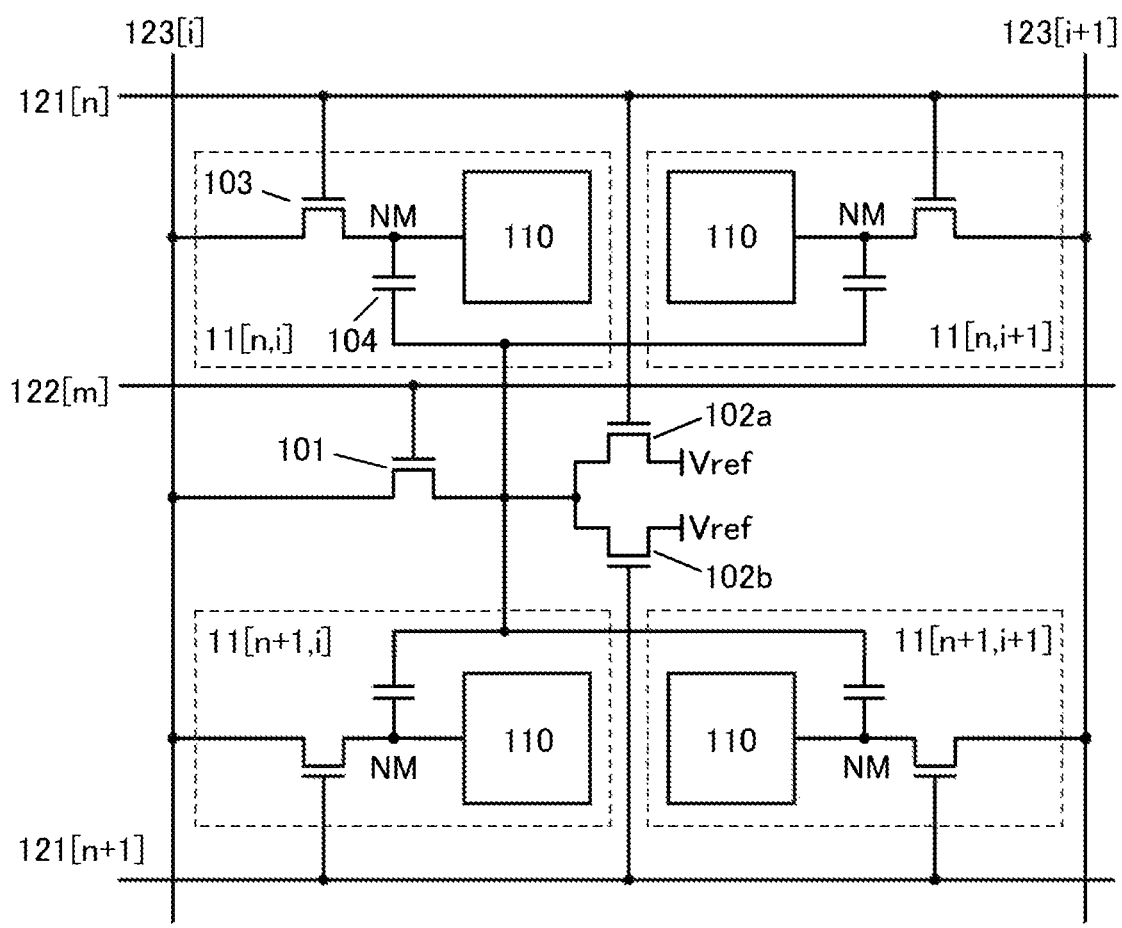
FIG. 7 shows a pixel array.

FIG. 7 shows part (corresponding to four pixels) of a pixel array including pixels 11, which employ the basic structure of the pixel 10. The pixel 11 includes the transistor 103, the capacitor 104, and the circuit block 110. Note that in the square brackets attached to the reference numerals, n and m each denote a certain row and i denotes a certain column (n, m, and i are natural numbers).

The pixels 11 can be arranged in a matrix, i.e., in an n-th row and an i-th column, an n-th row and an (i+x) column (x is a natural number), an (n+1)-th row and an i-th column, and an (n+1)-th row and an (i+x)-th row. Note that FIG. 7 shows the arrangement where x is 1.

In the pixel array, the transistors 101, 102a, and 102b which are electrically connected to the four pixels 11 are provided. The transistors 102a and 102b have the function of the transistor 102 included in the pixel 10.

The transistor 101 is a component of each pixel 11, that is, shared by the four pixels. The transistor 102a is a component of the pixels 11[n, i] and 11[n, i+1], that is, shared by the two pixels. The transistor 102b is a component of the pixel 11[n+1, i] and 11[n+1, i+1], that is, shared by the two pixels. Note that the transistors 101, 102a, and 102b may be dispersed in any of the pixel regions.

In each of the pixels 11, the one of the source and the drain of the transistor 103 is electrically connected to the one electrode of the capacitor 104. The one electrode of the capacitor 104 is electrically connected to the circuit block 110. The other electrode of the capacitor 104 is electrically connected to the one of the source and the drain of the transistor 101. The one of the source and the drain of the transistor 101 is electrically connected to one of a source and a drain of the transistor 102a. The one of the source and the drain of the transistor 101 is electrically connected to one of a source and a drain of the transistor 102b.

For some of the same operations, the number of required wirings and transistors can be smaller in this pixel array than in the structure in which the pixels 10 are simply arranged in a matrix.

Even when the resolutions of the display device and the image data are different from each other, proper display can be performed by changing input paths of the image data and the correction data, not by upconversion or downconversion.

With reference to timing charts of FIGS. 8A1 and 8A2, an operation example in which different data is written into each pixel 11 is described. This operation corresponds to, for example, the case where image data for high resolution (8K4K data) is input to a display device that includes pixels corresponding to 8K4K. Although the operation for one pixel 11 is described, the same operation also applies to the other pixels 11.

In the following description, "H" represents a high potential, "L" represents a low potential, and "M" represents a certain potential between the high potential and the low potential.

Note that "M" can be a reference potential such as 0 V or GND but may be another potential. In addition, "VsH" represents the image data for high resolution and "Vp1" represent the correction data for high resolution. In other words, "Vp1" can also represent arbitrary first data and "VsH" can also represent arbitrary second data.

First, the operation of writing the image data "VsH" into the node NM is described with reference to FIG. 8A1. Note that in potential distribution, potential coupling, or potential loss, detailed changes due to a circuit configuration, operation timing, or the like are not considered.

At time T1, the potential of the wiring 121 is set to "H", the potential of the wiring 122 is set to "L", and the potential of the wiring 123 is set to "VsH", so that the transistor 102 is turned on and the potential of the other electrode of the capacitor 104 becomes "Vref". This operation is a reset operation for a later correction operation (capacitive coupling operation).

In addition, the transistor 103 is turned on and the potential (image data "VsH") of the wiring 123 is written to the node NM.

At time T2, the potential of the wiring 121 is set to "L", the potential of the wiring 122 is set to "L", and the potential of the wiring 123 is set to "M", so that the transistor 102 and the transistor 103 are turned off and the image data "VsH" is held in the node NM. In addition, "VsH−Vref" is held in the capacitor 104.

The operation of writing the image data "VsH" has been described so far. Next, the operation of correcting the image data "VsH" and the display operation of the display element in the circuit block 110 are described with reference to FIG. 8A2.

The operations in FIGS. 8A1 and 8A2 can be sequentially performed in one horizontal period. Alternatively, the operations in FIGS. 8A1 and 8A2 may be performed in a k-th frame (k is a natural number) and a k+1-th frame, respectively. Alternatively, after the operation in FIG. 8A1, the operation in FIG. 8A2 may be performed more than once.

At time T11, the potential of the wiring 121 is set to "L", the potential of the wiring 122 is set to "H", and the potential of the wiring 123 is set to "Vp1", so that the transistor 101 is turned on and the potential "Vp1" of the wiring 123 is added to the potential of the node NM by capacitive coupling of the capacitor 104. At this time, the potential of the node NM is "VsH−Vref+Vp1". When "Vref" is 0, the potential of the node NM becomes "VsH+Vp1". Note that in the case where the correction is not performed, the same potential as "Vref" is supplied in the above operation as the correction data "Vp1".

At time T12, the potential of the wiring 121 is set to "L", the potential of the wiring 122 is set to "L", and the potential of the wiring 123 is set to "M", so that the transistor 101 is turned off and the potential of the node NM is held at "VsH+Vp1".

After that, the display element included in the circuit block 110 performs the display operation corresponding to the potential of the node NM. Note that depending on the structure of the circuit block, the display operation might start at time T1 or time T11.

Correction is thus performed in the selected pixels, whereby HDR display or the like can be performed. Note that the value of the correction data "Vp1" is the same for each four pixels, which is sufficiently effective in obtaining a visual contrast effect. In the case where the correction is not performed, the potential of the wiring 123 is kept at "M" during time T11. Alternatively, the potential of the wiring 122 is set to "L" so that the transistor 101 is prevented from being turned on.

Next, the operation of writing the same data to the four pixels 11 is described with reference to timing charts of FIGS. 8B1 and 8B2. This operation corresponds to, for example, the case where image data for low resolution (4K2K data) is input to a display device that includes pixels corresponding to 8K4K.

First, the operation of writing correction data "Vp2" into the node NM is described with reference to FIG. 8B1. In the following description, "VsL" represents the image data for low resolution and "Vp2" denotes correction data for low resolution. Note that "Vp2" can also represent arbitrary first data, and "VsL" can also represent arbitrary second data.

At time T1, the potential of the wiring 121 is set to "H", the potential of the wiring 122 is set to "L", and the potential of the wiring 123 is set to "Vp2", so that the transistor 102 is turned on and the potential of the other electrode of the capacitor 104 becomes "Vref". This operation is a reset operation for a later correction operation (capacitive coupling operation).

In addition, the transistor 103 is turned on and the potential of the wiring 123 (correction data "Vp2") is written to the node NM.

At time T2, the potential of the wiring 121 is set to "L", the potential of the wiring 122 is set to "L", and the potential of the wiring 123 is set to "M", so that the transistor 102 and the transistor 103 are turned off and the correction data "Vp2" is held in the node NM. In addition, "Vp2−Vref" is held in the capacitor 104.

The operation of writing the correction data "Vp2" has been described so far. Note that in the case where the correction is not performed, the same potential as "Vref" is supplied in the above operation as the correction data "Vp2".

Next, the operation of correcting the image data "VsL" and the display operation of the display element in the circuit block 110 are described with reference to FIG. 8B2.

The operations in FIGS. 8B1 and 8B2 can be sequentially performed in one horizontal period. Alternatively, the operations in FIGS. 8B1 and 8B2 may be performed in a k-th frame and a k+1-th frame, respectively. Alternatively, after the operation in FIG. 8B1, the operation in FIG. 8B2 may be performed more than once.

At time T11, the potential of the wiring 121 is set to "L", the potential of the wiring 122 is set to "H", and the potential of the wiring 123 is set to "VsL", so that the transistor 101 is turned on and the potential "VsL" of the wiring 123 is added to the potential of the node NM by capacitive coupling of the capacitor 104. At this time, the potential of the node NM is "Vp2−Vref+VsL". When "Vref" is 0, the potential of the node NM becomes "Vp2+VsL".

At time T12, the potential of the wiring 121 is set to "L", the potential of the wiring 122 is set to "L", and the potential of the wiring 123 is set to "M", so that the transistor 101 is turned off and the potential of the node NM is held at "Vp2+VsL".

After that, the display element included in the circuit block 110 performs the display operation corresponding to the potential of the node NM. Note that depending on the structure of the circuit block, the display operation might start at time T11.

As the correction data "Vp2", a different value can be input to each pixel 11. Thus, even with the same image data "VsL", each pixel 11 is capable of displaying a different image. That is, upconversion can be performed. Note that in the case where the correction is not performed, the same image is displayed by each four pixels.

By the above operation, the original image data can be input to the display device without being upconverted, so that proper display can be performed. Alternatively, correction appropriate for image display can be performed.

FIG. 9A is an example of a block diagram showing the display device of one embodiment of the present invention. The display device includes a pixel array 12 where the pixels 11 are arranged in a matrix, a row driver 13, a column driver 14, a circuit 15, and a selection circuit 16. Note that in FIG. 9A, the transistors 102a and 102b are shown as one block, and the portion connected to the wiring supplying the potential "Vref" is omitted.

The row driver 13 can have a structure in which a shift register 20 and a buffer circuit 21 are combined, for example. When the conduction of the buffer circuit 21 is controlled, data can be output to the wiring 121 or the wiring 122.

The column driver 14 can have a structure in which a shift register 22 and a buffer circuit 23 are combined, for example. When the conduction of the buffer circuit 23 is controlled, data can be output to the wiring 123.

The circuit 15 has a function of generating the correction data. The circuit 15 can also be referred to as an external device for generating the correction data.

The row driver 13 is capable of controlling the conduction of the transistors 101, 102a, and 102b. The column driver 14 is capable of supplying the correction data or the image data to the wiring 123.

The image data "VsH" for low resolution (e.g., 8K4K data) or the image data "VsL" for low resolution is input to the circuit 15. When the image data "VsH" is input, the correction data "Vp1" is generated. When the image data "VsL" is input, the correction data "Vp2" is generated.

The selection circuit 16 is capable of outputting the correction data "Vp1" and "Vp2" generated outside or the image data "VsH" and "VsL", in addition to the correction data "Vp1" and "Vp2" which are generated in the circuit 15, to the column driver 14.

In the structure shown in FIG. 9A, for example, output stages of each driver can be reduced by half for a low-resolution display operation without correction, which reduces power consumption.

The circuit 15 may also include a neural network. For example, the use of a deep neural network that has learned a huge number of images as teacher data allows generation of highly accurate correction data.

Figure 10A:
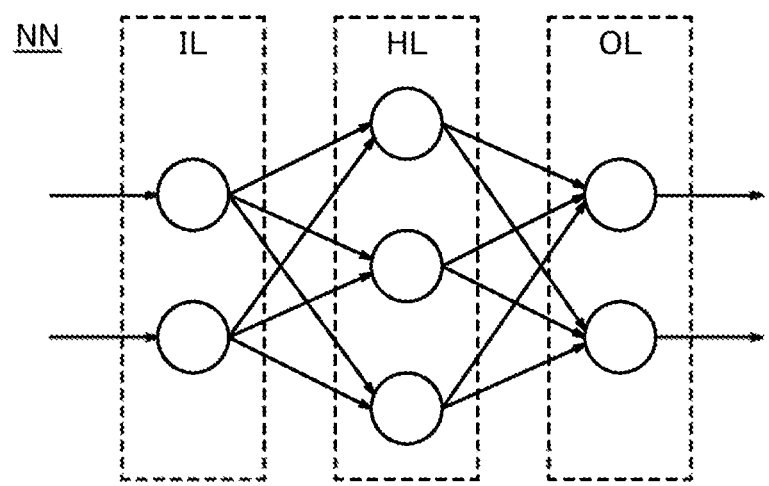
FIGS. 10A and 10B show a structure example of a neural network.

As shown in FIG. 10A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a deep neural network (DNN), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 10B:
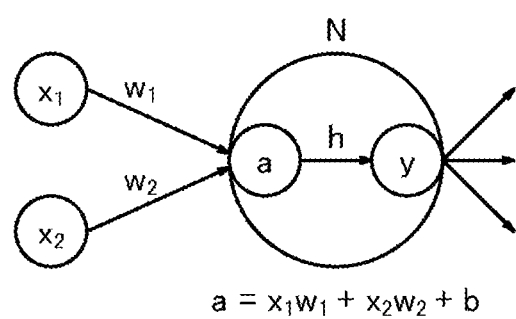

FIG. 10B shows an example of an operation with the neurons. Here, a neuron N and two neurons in the previous layer which output signals to the neuron N are shown. An output $x_1$ of a neuron in the previous layer and an output $x_2$ of a neuron in the previous layer are input to the neuron N. Then, in the neuron N, a total sum $x_1w_1+x_2w_2$ of a multiplication result $(x_1w_1)$ of the output $x_1$ and a weight $w_1$ and a multiplication result $(x_2w_2)$ of the output $x_2$ and a weight $w_2$ is calculated, and then a bias b is added as necessary, so that the value $a=x_1w_1+x_2w_2+b$ is obtained. Then, the value a is converted with an activation function h, and an output signal $y=h(a)$ is output from the neuron N.

In this manner, the operation with the neurons includes the operation that sums the products of the outputs and the weights of the neurons in the previous layer, that is, the product-sum operation $(x_1w_1+x_2w_2$ described above). This product-sum operation may be performed using a program on software or using hardware. In the case where the product-sum operation is performed by hardware, a product-sum arithmetic circuit can be used. Either a digital circuit or an analog circuit can be used as this product-sum arithmetic circuit.

The product-sum arithmetic circuit may be formed using a Si transistor or an OS transistor. An OS transistor is particularly preferably used as a transistor included in an analog memory of the product-sum arithmetic circuit because of its extremely low off-state current. Note that the product-sum arithmetic circuit may include both a Si transistor and an OS transistor.

Note that the correction data can also be generated not only in the circuit 15 but also in the circuit 120 described above (see FIG. 9B). The correction data may be generated based on data obtained by reading the luminance of grayscale display in a display portion with a luminance meter or data obtained by reading a photograph of the display. A sensor 24 capable of sensing the luminance of the display and a circuit 25 capable of generating the correction data by sensing deterioration of the display element may be provided (see FIG. 9C).

Figure 11:
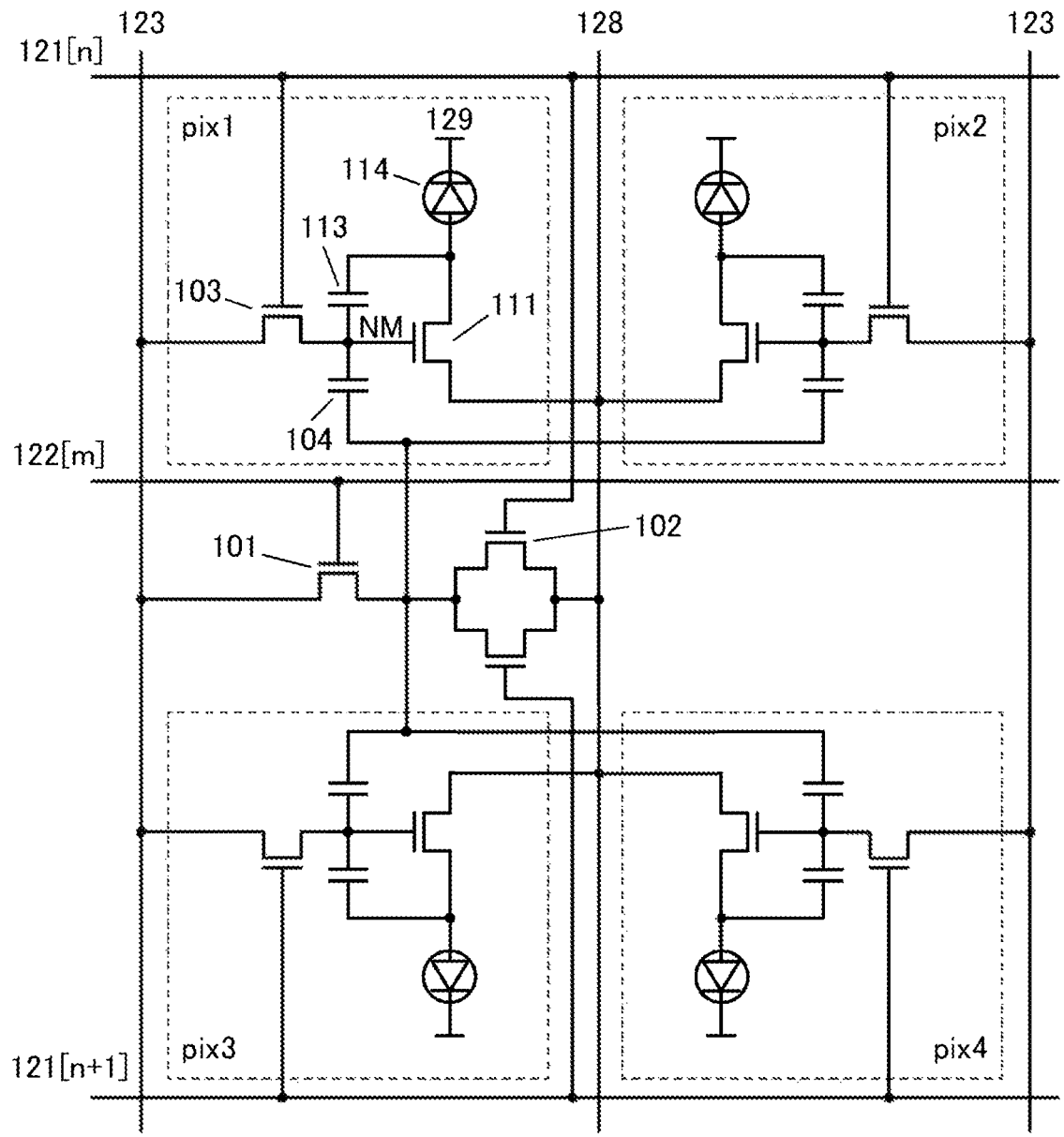
FIG. 11 shows a structure of a pixel array used for simulation.

Next, simulation results of a structure in which the circuit block shown in FIG. 4A is applied to the pixel array shown in FIG. 7 are described (see FIG. 11). The parameters were as follows: the size of the transistor 111 was 6 μm/6 μm (L/W), the size of the other transistors was 4 μm/4 μm (L/W), the capacitance of the capacitor 104 was 150 fF, the capacitance of the capacitor 113 was 50 fF, the EL element 114 was an FN diode model, the wiring 128 was set at an anode potential of +10 V, "Vref" was +1 V, the wiring 129 was set at a cathode potential of −5 V, the minimum value of the image data and the correction data was +1 V, and the maximum value thereof was +8 V. Note that SPICE was used for circuit simulation software.

Figure 12A:
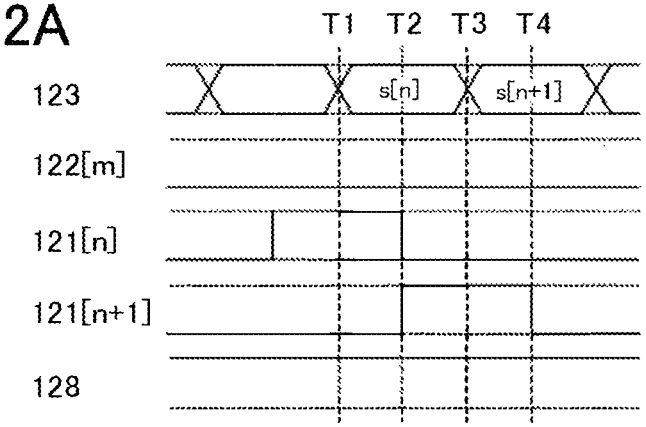
FIGS. 12A to 12C show simulation results.
Figure 12B:
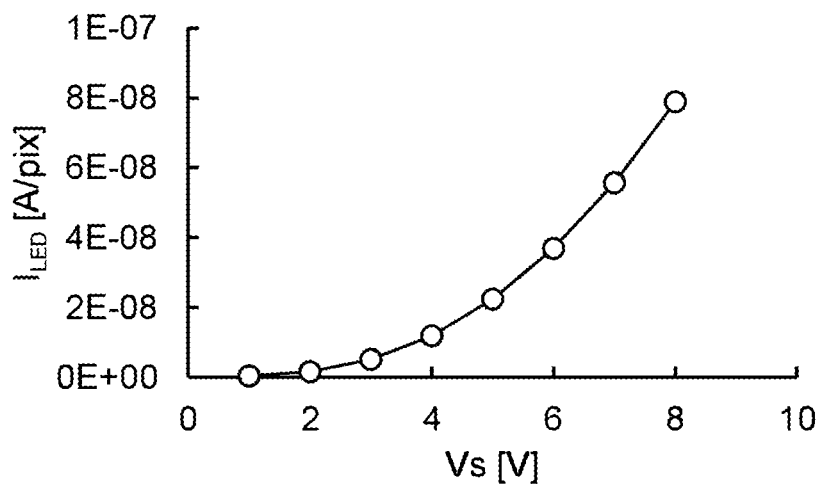
Figure 12C:
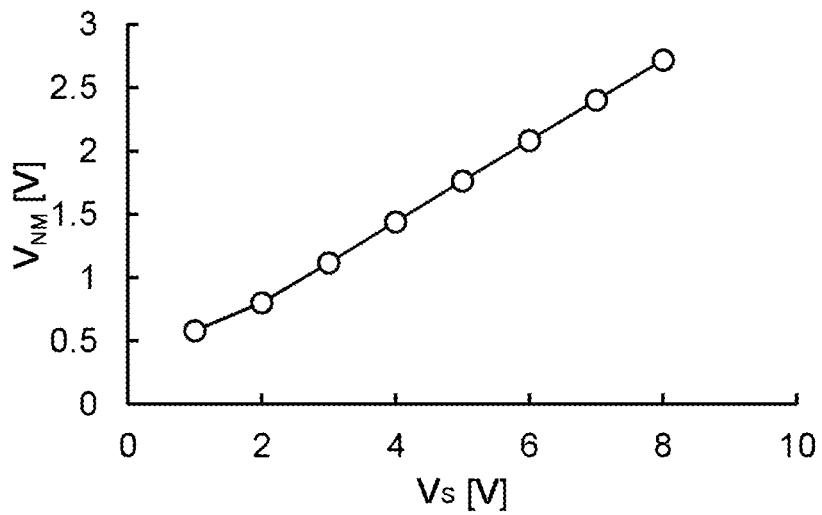

FIGS. 12A to 12C show simulation results of testing for high-resolution display (without correction). FIG. 12A is a timing chart used for the testing. The transistor 103 is turned on at time T1 to time T2 shown in FIG. 12A, whereby the image data "Vs"(s[n]) is written from the wiring 123. In addition, the image data "Vs"(s[n+1]) is written at time T3 to time T4. At this time, the wiring 128 is at the anode potential.

FIG. 12B shows simulation results of a current ($I_{LED}$), which flows through the EL element 114, versus the image data "Vs". Although the simulation results for one pixel are shown in FIG. 12B, grayscale display in all of the pixels (pix1 to pix4) are confirmed.

FIG. 12C shows simulation results of a change in the potential "$V_{NM}$" of the node NM versus the image data "Vs". It is confirmed that the potential "$V_{NM}$" of the node NM is proportional to the image data "Vs" for all of the pixels.

Thus, it is confirmed that the image data for high resolution "Vs", which is supplied from the wiring 123, can be displayed.

Figure 13A:
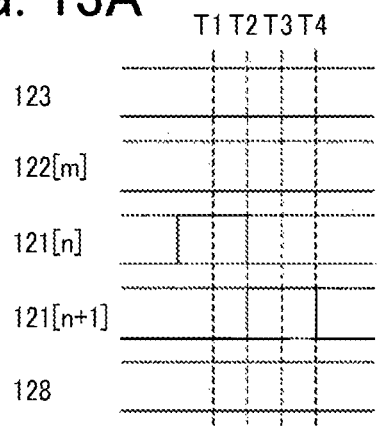
FIGS. 13A to 13D show simulation results.
Figure 13B:
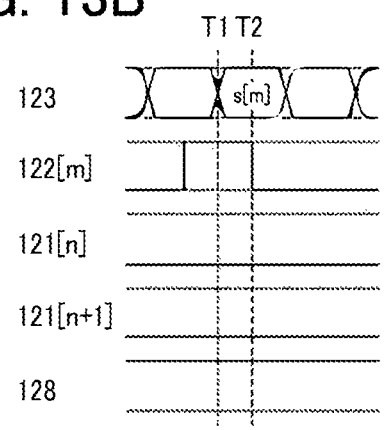

FIGS. 13A to 13D show simulation results of testing for low-resolution display (without correction). FIGS. 13A and 13B are timing charts used for the testing. First, the potential of the wiring 123 is set to the minimum value (+1 V), and the correction data "Vp"(p) is written to all the pixels at time T1 to time T4 shown in FIG. 13A. At this time, the wiring 128 is set at the potential "Vref" (+1 V), and therefore the differential potential held in the capacitor 104 is 0. That is, correction is not performed.

After that, the transistor 101 is turned on at time T1 to time T2 shown in FIG. 13B, whereby the image data "Vs"(s[m]) is written from the wiring 123.

Figure 13C:
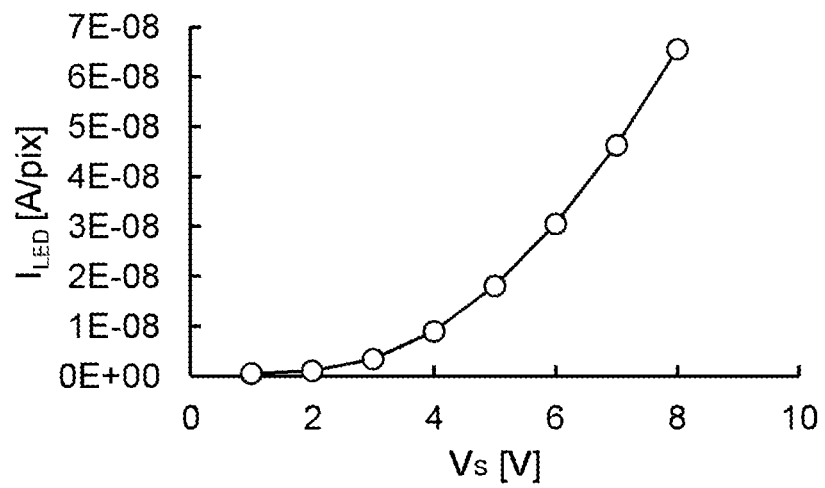

FIG. 13C shows simulation results of the current ($I_{LED}$), which flows through the EL element 114, versus the image data "Vs". Although the simulation results for one pixel are shown in FIG. 13C, grayscale display in all of the pixels (pix1 to pix4) are confirmed.

Figure 13D:
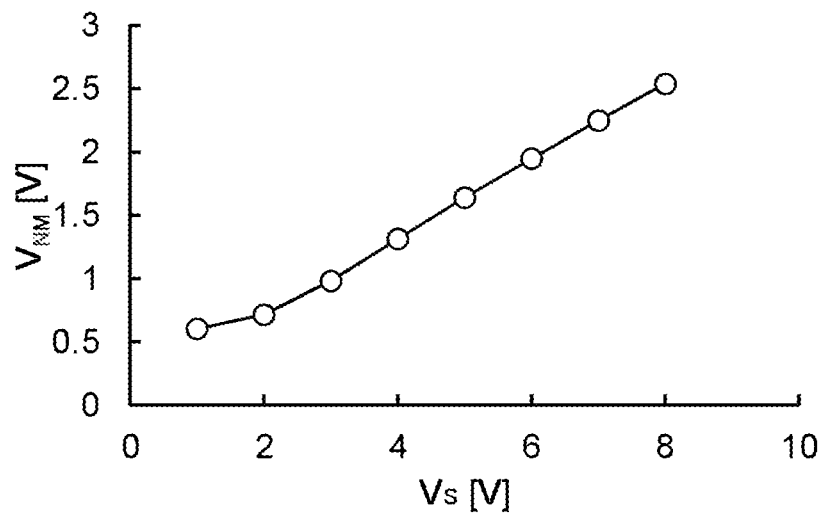

FIG. 13D shows simulation results of a change in the potential "$V_{NM}$" of the node NM versus the image data "Vs". It is confirmed that the potential "$V_{NM}$" of the node NM is proportional to the image data "Vs" for all of the pixels.

Thus, it is confirmed that the image data "Vs" for low resolution which is supplied from the wiring 123 can be displayed.

Figure 14A:
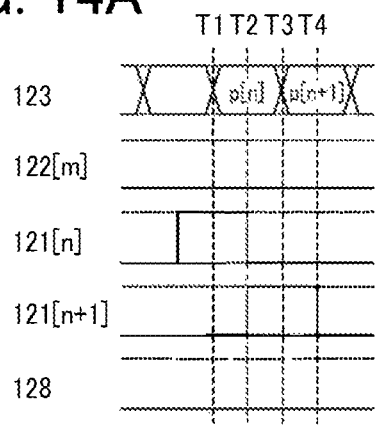
FIGS. 14A to 14D show simulation results.
Figure 14B:
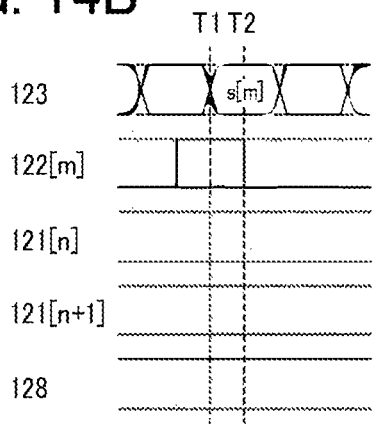

FIGS. 14A to 14D show simulation results of testing for low-resolution display (with correction). FIGS. 14A and 14B are timing charts used for the testing. First, the desired correction data "Vp" is supplied to the wiring 123, and the correction data "Vp"(p[n]) is written at time T1 to time T2 shown in FIG. 14A. In addition, the correction data "Vp" (p[n+1]) is written at time T3 to time T4. At this time, the wiring 128 is set at the potential "Vref" (+1 V), and therefore the differential potential held in the capacitor 104 is "Vp−1".

After that, the transistor 101 is turned on at time T1 to time T2 shown in FIG. 14B, whereby the image data "Vs" is written from the wiring 123 and the correction data is added to the image data. At this time, the wiring 128 is at the anode potential.

Figure 14C:
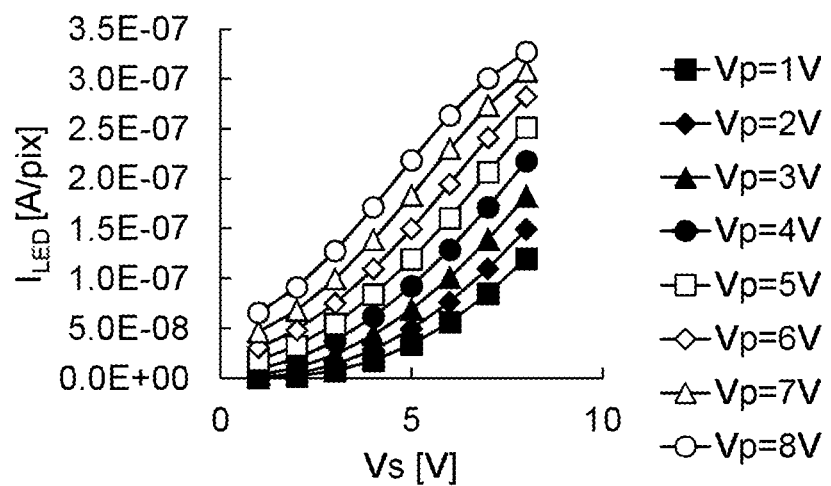

FIG. 14C shows simulation results of the current ($I_{LED}$), which flows through the EL element 114, versus the image data "Vs". Grayscale display is confirmed in each of the cases where 1 V to 8 V are written as the correction data "Vp" and combined with the image data "Vs".

Figure 14D:
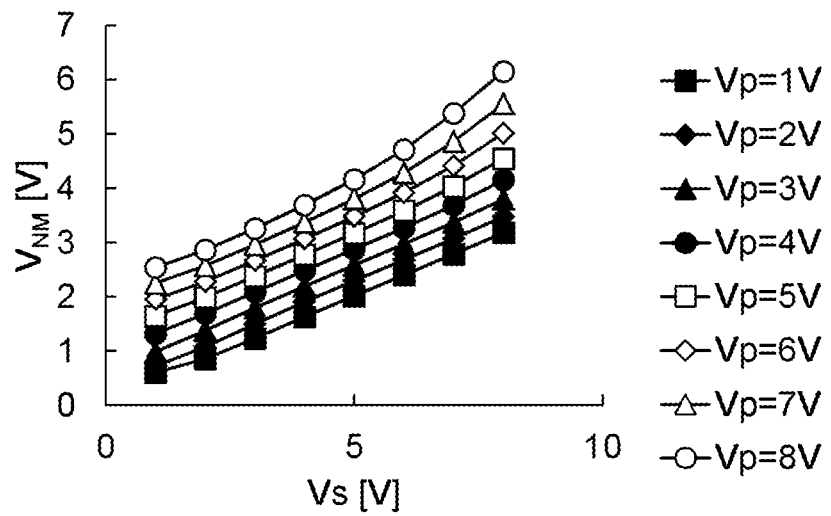

FIG. 14D shows simulation results of a change in the potential "$V_{NM}$" of the node NM versus the image data "Vs". It is confirmed that the potential "$V_{NM}$" of the node NM tends to be proportional to the image data "Vs" in each of the cases where 1 V to 8 V are written as the correction data "Vp" and combined with the image data "Vs".

The above confirms that effective display is possible by combining the correction data "Vp" and the image data "Vs" for low resolution which are supplied from the wiring 123.

Figure 15:
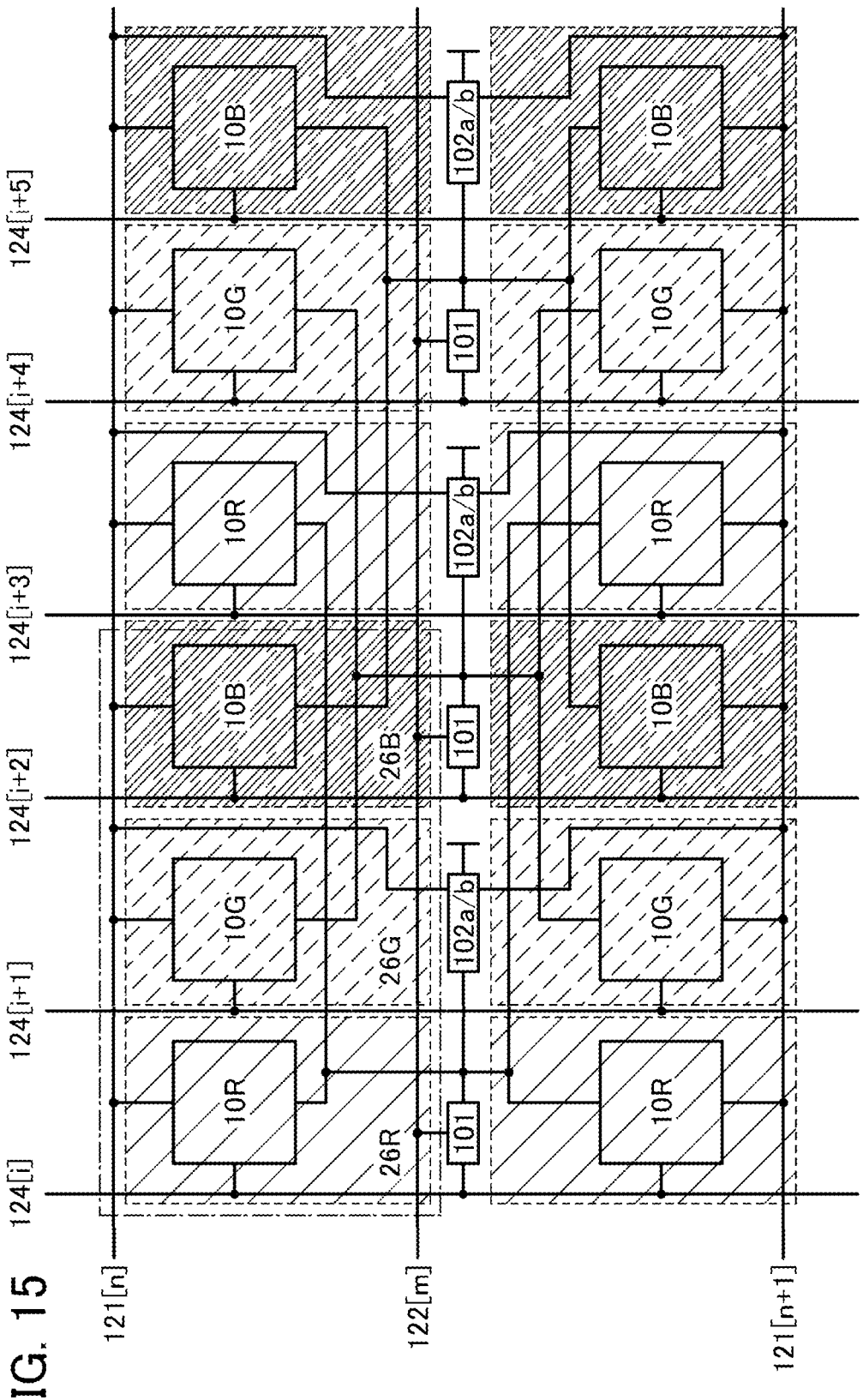
FIG. 15 shows a structure of pixels.

FIG. 15 shows an example of an EL display device capable of color display, in which a pixel of one embodiment of the present invention is employed. A pixel of a display device capable of color display generally includes a combination of sub-pixels that emit light of red (R), green (G), and blue (B). FIG. 15 shows four pixels in the longitudinal and lateral directions each composed of three sub-pixels 10R, 10G, and 10B arranged in the lateral direction. Note that in FIG. 15, the transistors 102a and 102b are shown as one block.

As described above, in one embodiment of the present invention, the correction data "Vp1" or the image data "VsL" can be input to four pixels (corresponding to four sub-pixels that emit light of the same color), which are arranged in a matrix and between which the transistor 101 is provided. The potential "Vref" can be supplied to two pixels (corresponding to two sub-pixels that emit light of the same color), which are arranged in the lateral direction and between which the transistors 102a and 102b are provided.

In a stripe arrangement, although sub-pixels are preferably arranged at regular distances, a constant distance between sub-pixels (between components having the same function) might be difficult to ensure in the case where a wiring or a transistor is sheared by the sub-pixels Thus, when electrodes 26R, 26G, and 26B are pixel electrodes connected to the sub-pixels 10R, 10G, and 10B, respectively, the electrodes 26R, 26G, and 26B are preferably arranged at regular distances as shown in FIG. 15. Note that here for clarity, the pixel electrode is assumed as a different component although can also be assumed as a component of the corresponding sub-pixel. This structure is effective for a top-emission EL display device or a reflective liquid crystal display device.

This embodiment can be implemented in combination with any of the structures described in the other embodiments and the like, as appropriate.

Embodiment 2

In this embodiment, structure examples of a display device including a liquid crystal element and a display device including an EL element are described. Note that the components, operations, and functions of the display device described in Embodiment 1 are not repeatedly described in this embodiment.

Figure 16A:
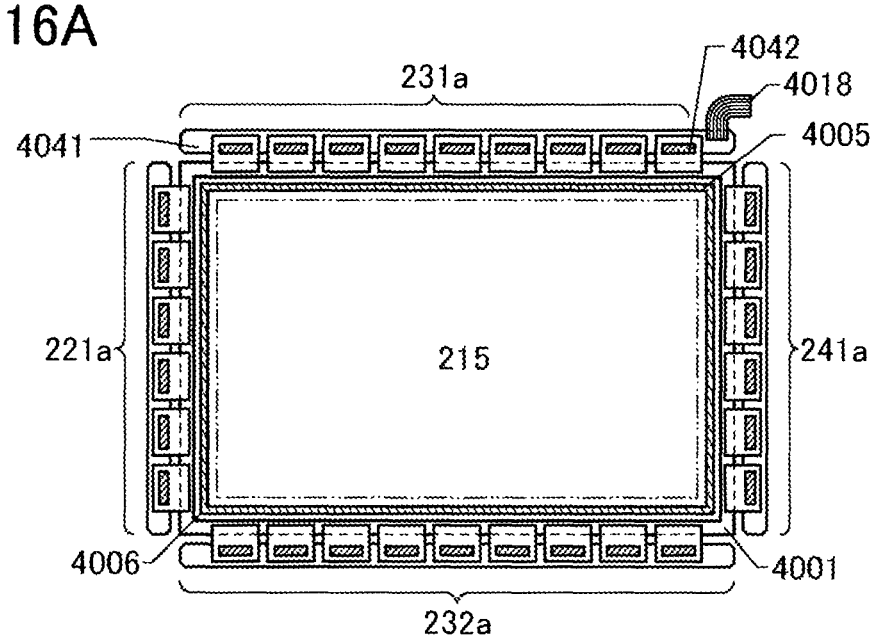
FIGS. 16A to 16C each show a display device.
Figure 16B:
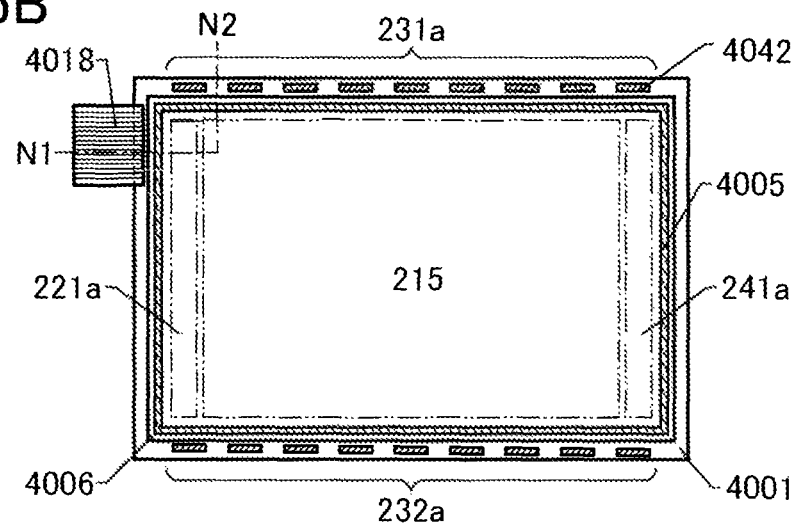
Figure 16C:
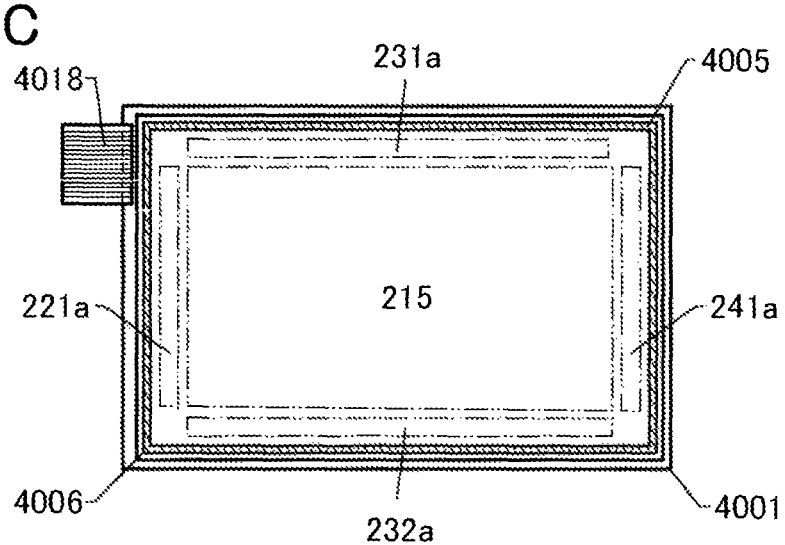

FIGS. 16A to 16C each show a structure of a display device in which one embodiment of the present invention can be used.

In FIG. 16A, a sealant 4005 is provided to surround a display portion 215 provided over a first substrate 4001. The display portion 215 is sealed with the sealant 4005 and a second substrate 4006.

The pixel array shown in FIG. 7 of Embodiment 1 can be provided in the display portion 215. Note that a scan line driver circuit and a signal line driver circuit which are described below correspond to the row driver and the column driver, respectively.

In FIG. 16A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The signal line driver circuit 231a and the signal line driver circuit 232a each function as the column driver described in Embodiment 1. The scan line driver circuit 221a functions as the row driver described in Embodiment 1. The common line driver circuit 241a has a function of supplying a predetermined potential to the wiring supplying power or the wiring supplying Vref described in Embodiment 1.

Signals and potentials are supplied to the scan line driver circuit 221a, the common line driver circuit 241a, the signal line driver circuit 231a, and the signal line driver circuit 232a through a flexible printed circuit (FPC) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not limited; a wire bonding method, a chip on glass (COG) method, a tape carrier package (TCP) method, a chip on film (COF) method, or the like can be used.

FIG. 16B shows an example in which the integrated circuits 4042 included in the signal line driver circuit 231a and the signal line driver circuit 232a are mounted by a COG method. Some or all of the driver circuits can be formed over the substrate where the display portion 215 is formed, whereby a system-on-panel can be obtained.

In the example shown in FIG. 16B, the scan line driver circuit 221a and the common line driver circuit 241a are formed over the substrate where the display portion 215 is formed. When the driver circuits are formed concurrently with pixel circuits in the display portion 215, the number of components can be reduced and accordingly the productivity can be increased.

In FIG. 16B, the sealant 4005 is provided to surround the display portion 215, the scan line driver circuit 221a, and the common line driver circuit 241a over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with display elements with the use of the first substrate 4001, the sealant 4005, and the second substrate 4006.

Although the signal line driver circuit 231a and the signal line driver circuit 232a are separately formed and mounted on the first substrate 4001 in the example shown in FIG. 16B, one embodiment of the present invention is not limited to this structure. The scan line driver circuit may be separately formed and then mounted, or part of the signal line driver circuits or part of the scan line driver circuits may be separately formed and then mounted. The signal line driver circuit 231a and the signal line driver circuit 232a may be formed over the substrate over which the display portion 215 is formed, as shown in FIG. 16C.

In some cases, the display device encompasses a panel in which the display element is sealed, and a module in which an IC or the like including a controller is mounted on the panel.

The display portion and the scan line driver circuit over the first substrate each include a plurality of transistors. As the transistors, the transistor described in the above embodiment can be used.

Transistors included in the peripheral driver circuits and transistors included in the pixel circuit of the display portion may have the same structure or different structures. The transistors included in the peripheral driver circuits may be transistors having the same structure or transistors having two or more different structures. Similarly, the transistors included in the pixel circuit may be transistors having the same structure or transistors having two or more different structures.

An input device 4200 can be provided over the second substrate 4006. The function of a touch panel can be obtained in the structure in which the input device 4200 is added to the display device shown in any of FIGS. 16A to 16C.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 17A:
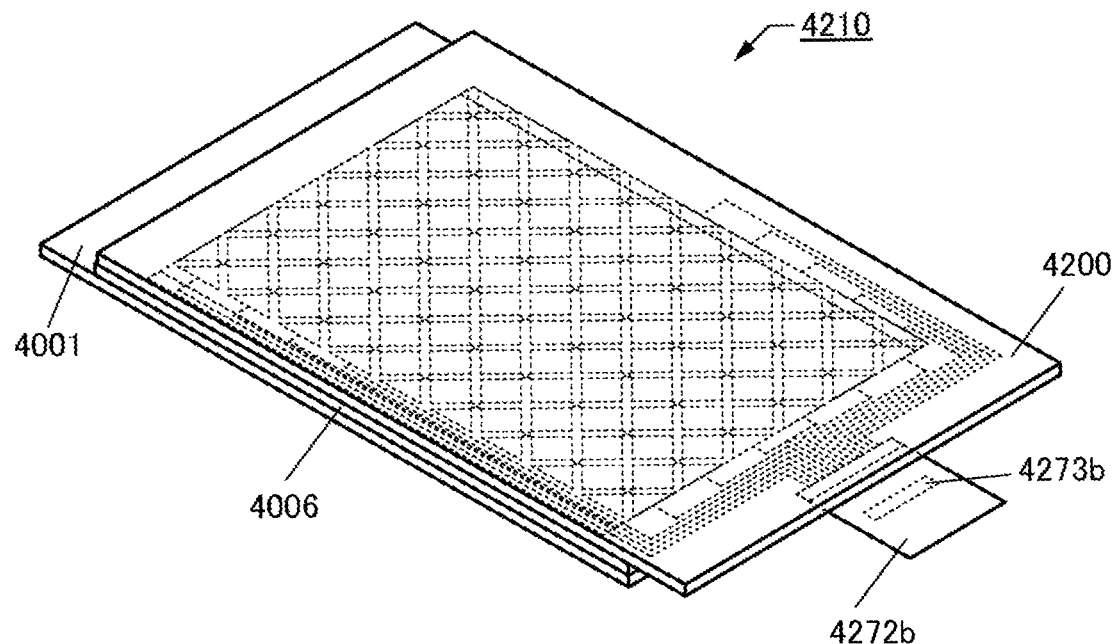
FIGS. 17A and 17B show a touch panel.
Figure 17B:
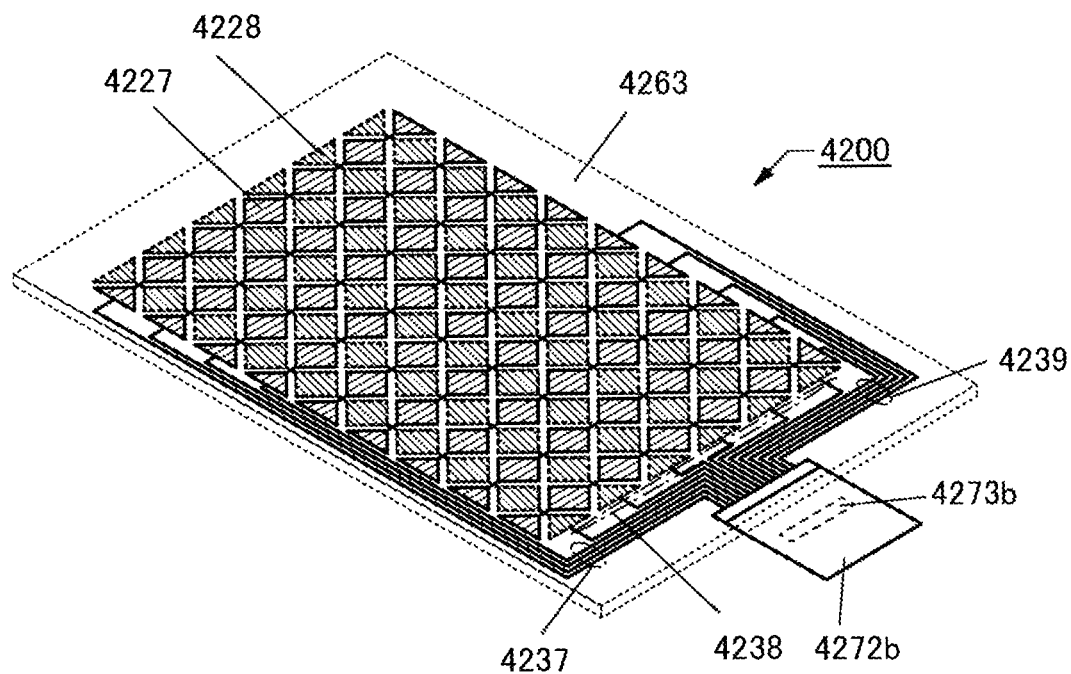

FIGS. 17A and 17B show an example of the touch panel. FIG. 17A is a perspective view of a touch panel 4210. FIG. 17B is a schematic perspective view of the input device 4200. Note that for simplicity, FIGS. 17A and 17B show only the major components.

The touch panel 4210 has a structure in which a display device and a sensor element that are formed separately are bonded together.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided on the FPC 4272b.

A touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

FIGS. 18A and 18B are cross-sectional views each taken along the chain line N1-N2 in FIG. 16B. Display devices shown in FIGS. 18A and 18B each include an electrode 4015, and the electrode 4015 is electrically connected to a terminal included in the FPC 4018 through an anisotropic conductive layer 4019. In FIGS. 18A and 18B, the electrode 4015 is electrically connected to a wiring 4014 in an opening formed in insulating layers 4112, 4111, and 4110.

The electrode 4015 is formed of the same conductive layer as a first electrode layer 4030, and the wiring 4014 is formed of the same conductive layer as source and drain electrodes of transistors 4010 and 4011.

The display portion 215 and the scan line driver circuit 221a provided over the first substrate 4001 each include a plurality of transistors. In FIGS. 18A and 18B, the transistor 4010 included in the display portion 215 and the transistor 4011 included in the scan line driver circuit 221a are shown as an example. In the examples shown in FIGS. 18A and 18B, the transistors 4010 and 4011 are bottom-gate transistors but may be top-gate transistors.

In FIGS. 18A and 18B, the insulating layer 4112 is provided over the transistors 4010 and 4011. In FIG. 18B, a partition wall 4510 is provided over the insulating layer 4112.

The transistors 4010 and 4011 are provided over an insulating layer 4102. The transistors 4010 and 4011 each include an electrode 4017 formed over the insulating layer 4111. The electrode 4017 can serve as a back gate electrode.

The display devices shown in FIGS. 18A and 18B each include a capacitor 4020. The capacitor 4020 includes an electrode 4021 formed in the same step as a gate electrode of the transistor 4010, and an electrode formed in the same step as a source electrode and a drain electrode of the transistor 4010. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor is set considering the off-state current of the transistors or the like.

The transistor 4010 provided in the display portion 215 is electrically connected to the display element. FIG. 18A shows an example of a liquid crystal display device using a liquid crystal element as the display element. In FIG. 18A, a liquid crystal element 4013 serving as the display element includes the first electrode layer 4030, a second electrode layer 4031, and a liquid crystal layer 4008. Insulating layers 4032 and 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031 (a cell gap). Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate. For example, circular polarization may be employed by using a polarizing substrate and a retardation substrate. In addition, a backlight, a side light, or the like may be used as a light source. A micro LED or the like may be used as the backlight or the side light.

In the display device shown in FIG. 18A, a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A layered film containing the materials of the coloring layers can also be used for the light-blocking layer. For example, a layered structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layers include a metal material, a resin material, and a resin material containing a pigment or a dye. The light-blocking layer and the coloring layer can be formed by an inkjet method, for example.

The display devices shown in FIGS. 18A and 18B each include the insulating layer 4111 and an insulating layer 4104. As the insulating layers 4104 and 4111, insulating layers through which an impurity element does not easily pass are used. A semiconductor layer of the transistor is positioned between the insulating layers 4104 and 4111, whereby entry of impurities from the outside can be prevented.

As the display element included in the display device, a light-emitting element utilizing electroluminescence (EL element) can be used. An EL element includes a layer containing a light-emitting compound (also referred to as an "EL layer") between a pair of electrodes. A potential difference greater than the threshold voltage of the EL element is generated between the pair of electrodes, whereby holes are injected to the EL layer from the anode side and electrons are injected to the EL layer from the cathode side. The injected electrons and holes are recombined in the EL layer and the light-emitting compound contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

In addition to the light-emitting compound, the EL layer may further include any of a substance with an excellent hole-injection property, a substance with an excellent hole-transport property, a hole-blocking material, a substance with an excellent electron-transport property, a substance with an excellent electron-injection property, a substance with a bipolar property (a substance with an excellent electron- and hole-transport property), and the like.

The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions. Note that the case in which an organic EL element is used as the light-emitting element is described here.

In order to extract light emitted from the light-emitting element, at least one of the pair of electrodes needs to be transparent. A transistor and a light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 18B shows an example of a light-emitting display device using a light-emitting element as a display element (also referred to as an "EL display device"). A light-emitting element 4513 which is a display element is electrically connected to the transistor 4010 provided in the display portion 215. The structure of the light-emitting element 4513 is the layered structure of the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The partition wall 4510 is formed using an organic insulating material or an inorganic insulating material. It is particularly preferable that the partition wall 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As color display methods, there are a method in which the light-emitting elements 4513 that emit white light are combined with a coloring layer and a method in which the light-emitting element 4513 that emits light of a different emission color is provided in each pixel. The former method is more productive than the latter method. The latter method, which requires separate formation of the light-emitting layer 4511 pixel by pixel, is less productive than the former method; however, the latter method can provide higher color purity of the emission color than the former method. In the latter method, the color purity can be further increased when the light-emitting elements 4513 have a microcavity structure.

The light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In a space which is formed with the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member in this manner with high air-tightness and little degasification so that the light-emitting element is not exposed to the outside air.

As the filler 4514, an ultraviolet curable resin or a thermosetting resin can be used as well as an inert gas such as nitrogen or argon; polyvinyl chloride (PVC), an acrylic-based resin, polyimide, an epoxy-based resin, a silicone-based resin, polyvinyl butyral (PVB), ethylene vinyl acetate (EVA), or the like can be used. A drying agent may be contained in the filler 4514.

A glass material such as a glass frit or a resin material such as a resin that is curable at room temperature (e.g., a two-component-mixture-type resin), a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Furthermore, the polarizing plate or the circularly polarizing plate may be provided with an anti-reflection film; for example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (each of which is also referred to as a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

This embodiment can be implemented in combination with any of the structures described in the other embodiments and the like, as appropriate.

Embodiment 3

In this embodiment, examples of transistors which can be used as the transistors described in the above embodiments are described with reference to drawings.

The display device of one embodiment of the present invention can be fabricated using a transistor with various structures, such as a bottom-gate transistor or a top-gate transistor. Therefore, a material for a semiconductor layer or the structure of a transistor can be easily changed depending on the existing production line.

[Bottom-Gate Transistor]

FIG. 19A1 is a cross-sectional view in the channel length direction of a channel-protective transistor 810 which is a type of bottom-gate transistor. In FIG. 19A1, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

The transistor 810 includes an insulating layer 741 over a channel formation region in the semiconductor layer 742. The transistor 810 also includes an electrode 744a and an electrode 744b which are over the insulating layer 726 and partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for regions of the electrodes 744a and 744b which are in contact with the semiconductor layer 742. The carrier concentration in the regions of the semiconductor layer 742 where oxygen vacancies are generated is increased, so that the regions become n-type regions (n$^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrodes 744a and 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that can prevent or reduce diffusion of impurities into the transistor from the outside. Note that the insulating layer 729 is not necessarily provided.

A transistor 811 shown in FIG. 19A2 is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region of a semiconductor layer is positioned between the gate electrode and the back gate electrode. Thus, the back gate electrode can function in a manner similar to that of the gate electrode. The potential of the back gate electrode may be the same as that of the gate electrode or may be a ground (GND) potential or an arbitrary potential. When the potential of the back gate electrode is changed independently of the potential of the gate electrode, the threshold voltage of the transistor can be changed.

The electrodes 746 and 723 can each function as a gate electrode. Thus, the insulating layers 726, 728, and 729 can each function as a gate insulating layer. The electrode 723 may be provided between the insulating layers 728 and 729.

In the case where one of the electrodes 746 and 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrodes 746 and 723 may be referred to as a "first gate electrode", and the other may be referred to as a "second gate electrode".

The electrodes 746 and 723 are provided with the semiconductor layer 742 therebetween and further have the same potential, which enlarges a region of the semiconductor layer 742 through which carriers flow in the film thickness direction. Accordingly, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. According to one embodiment of the present invention, the area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

FIG. 19B1 is a cross-sectional view in the channel length direction of a channel-protective transistor 820, which has a structure different from the structure of the transistor in FIG. 19A1. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening formed by selectively removing part of the insulating layer 741 which overlaps with the semiconductor layer 742. The semiconductor layer 742 is electrically connected to the electrode 744b through another opening formed by selective removal of part of the insulating layer 741 which overlaps with the semiconductor layer 742. A region of the insulating layer 741 which overlaps with the channel formation region can function as a channel protective layer.

A transistor 821 shown in FIG. 19B2 is different from the transistor 820 in that the electrode 723 which can function as a back gate electrode is provided over the insulating layer 729.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The length between the electrode 744a and the electrode 746 and the length between the electrode 744b and the electrode 746 are larger in the transistors 820 and 821 than in the transistors 810 and 811. Thus, the parasitic capacitances generated between the electrode 744a and the electrode 746 and between the electrode 744b and the electrode 746 can be smaller in the transistors 820 and 821 than in the transistors 810 and 811. According to one embodiment of the present invention, a transistor with favorable electrical characteristics can be provided.

FIG. 19C1 is a cross-sectional view in the channel length direction of a channel-etched transistor 825, which is a kind of bottom-gate transistor. In the transistor 825, the electrodes 744a and 744b are formed without the insulating layer 741. Thus, part of the semiconductor layer 742 which is exposed at the time of forming the electrodes 744a and 744b might be etched. Note that since the insulating layer 741 is not provided, the productivity of the transistor can be increased.

A transistor 826 shown in FIG. 19C2 is different from the transistor 825 in that the electrode 723 which can function as a back gate electrode is provided over the insulating layer 729.

FIGS. 20A1, 20A2, 20B1, 20B2, 20C1, and 20C2 are cross-sectional views in the channel width direction of the transistors 810, 811, 820, 821, 825, and 826, respectively.

In each of the structures shown in FIGS. 20B2 and 20C2, the gate electrode is connected to the back gate electrode, and the gate electrode and the back gate electrode have the same potential. In addition, the semiconductor layer 742 is positioned between the gate electrode and the back gate electrode.

The length in the channel width direction of each of the gate electrode and the back gate electrode is longer than that of the semiconductor layer 742. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be surrounded by electric fields of the gate electrode and the back gate electrode.

The transistor device structure in which the semiconductor layer 742, where the channel formation region is formed, is surrounded by electric fields of the gate electrode and the back gate electrode as in the transistor 821 or the transistor 826, can be referred to as a surrounded channel (S-channel) structure.

The S-channel structure enables the gate electrode and/or the back gate electrode to effectively apply an electric field for inducing the channel to the semiconductor layer 742, whereby the transistor has improved current drive capability and excellent on-state current characteristics. In addition, the transistor can be miniaturized because the on-state current can be increased. The S-channel structure also increases the mechanical strength of the transistor.

[Top-Gate Transistor]

A transistor 842 shown in FIG. 21A1 is a type of top-gate transistor. The electrodes 744a and 744b are electrically connected to the semiconductor layer 742 through openings formed in the insulating layers 728 and 729.

Part of the insulating layer 726 that does not overlap with the electrode 746 is removed, and an impurity 755 is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced not through the insulating layer 726. Thus, a lightly doped drain (LDD) region is formed in the region of the semiconductor layer 742 which does not overlap with the electrode 746.

A transistor 843 shown in FIG. 21A2 is different from the transistor 842 in that the electrode 723 is included. The transistor 843 includes the electrode 723 which is formed over the substrate 771. The electrode 723 partly overlaps with the semiconductor layer 742 with the insulating layer 772 therebetween. The electrode 723 can function as a back gate electrode.

As in a transistor 844 shown in FIG. 21B1 and a transistor 845 shown in FIG. 21B2, the insulating layer 726 in a region that does not overlap with the electrode 746 may be completely removed. Alternatively, as in a transistor 846 shown in FIG. 21C1 and a transistor 847 shown in FIG. 21C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIGS. 22A1, 22A2, 22B1, 22B2, 22C1, and 22C2 are cross-sectional views in the channel width direction of the transistors 842, 843, 844, 845, 846, and 847, respectively.

The transistors 843, 845, and 847 each have the above-described S-channel structure; however, one embodiment of the present invention is not limited to this, and the transistors 843, 845, and 847 do not necessarily have the S-channel structure.

This embodiment can be implemented in combination with any of the structures described in the other embodiments and the like, as appropriate.

Embodiment 4

Examples of an electronic device that can use the display device according to one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 23A to 23F show specific examples of such electronic devices.

Figure 23A:
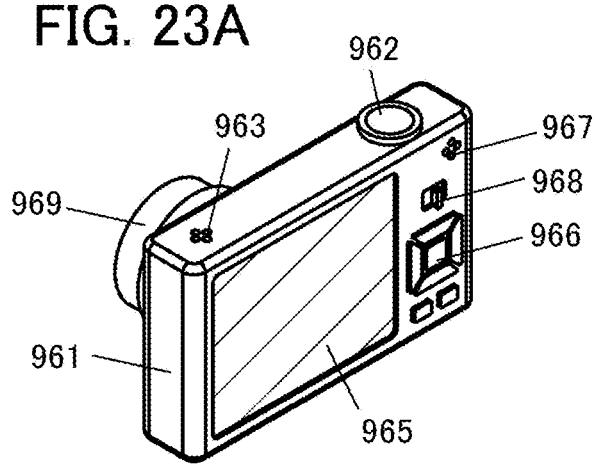
FIGS. 23A to 23F each show an electronic device.

FIG. 23A shows a digital camera, which includes a housing 961, a shutter button 962, a microphone 963, a speaker 967, a display portion 965, operation keys 966, a zoom lever 968, a lens 969, and the like. The use of the display device of one embodiment of the present invention for the display portion 965 enables display of a variety of images.

Figure 23B:
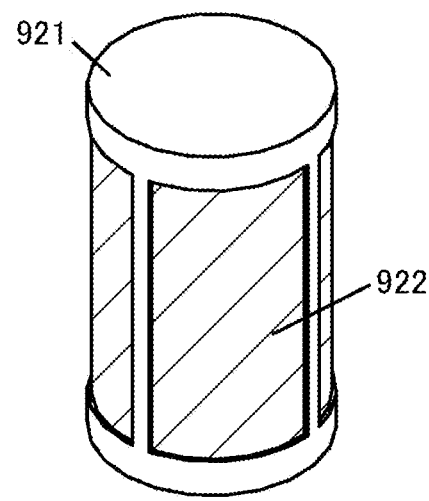

FIG. 23B shows a digital signage, which has large display portions 922. The digital signage can be installed on the side surface of a pillar 921, for example. The use of the display device of one embodiment of the present invention for the display portion 922 enables display of a variety of images.

Figure 23C:
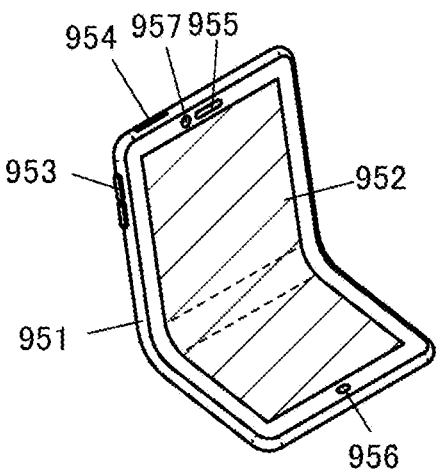

FIG. 23C shows a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as shown in the figure. The use of the display device of one embodiment of the present invention for the display portion 952 enables display of a variety of images.

Figure 23D:
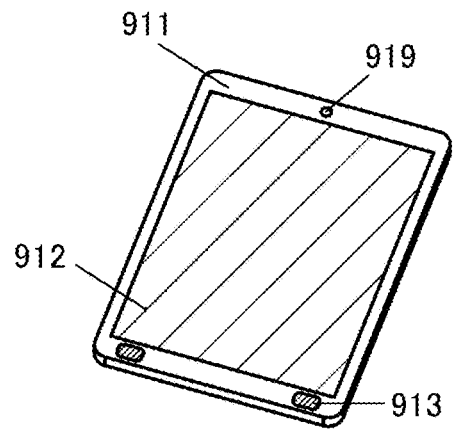

FIG. 23D shows a portable data terminal, which includes a housing 911, a display portion 912, speakers 913, a camera 919, and the like. A touch panel function of the display portion 912 enables input and output of information. The use of the display device of one embodiment of the present invention for the display portion 912 enables display of a variety of images.

Figure 23E:
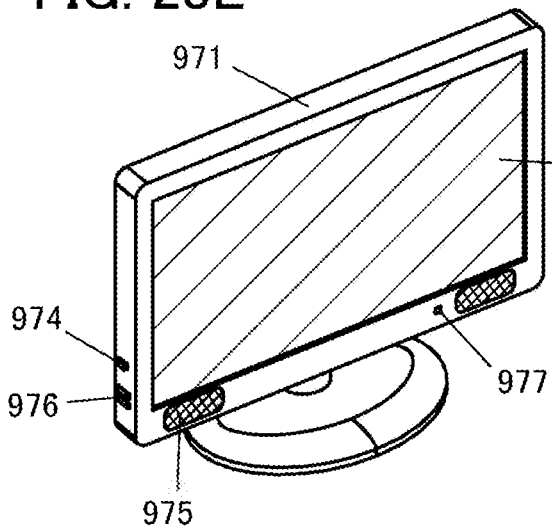

FIG. 23E shows a television, which includes a housing 971, a display portion 973, an operation key 974, speakers 975, a communication connection terminal 976, an optical sensor 977, and the like. The display portion 973 includes a touch sensor that enables input operation. The use of the display device of one embodiment of the present invention for the display portion 973 enables display of a variety of images.

Figure 23F:
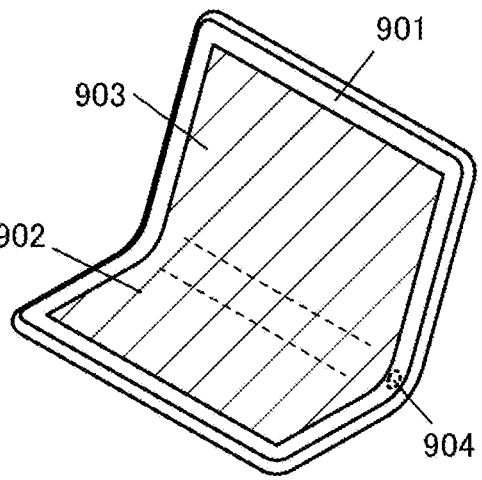

FIG. 23F shows an information processing terminal, which includes a housing 901, a display portion 902, a display portion 903, a sensor 904, and the like. The display portions 902 and 903 are formed using one display panel and flexible. The housing 901 is also flexible, can be used in a bent state as shown in the figure, and can be used in a flat plate shape like a tablet terminal. The sensor 904 can sense the shape of the housing 901, and it is possible to switch display on the display portions 902 and 903 when the housing 901 is bent, for example. The use of the display device of one embodiment of the present invention for the display portions 902 and 903 enables display of a variety of images.

This embodiment can be implemented in combination with any of the structures described in the other embodiments, examples, and the like, as appropriate.

REFERENCE NUMERALS

10: pixel, 10B: sub-pixel, 10G: sub-pixel, 10R: sub-pixel, 11: pixel, 11B: sub-pixel, 11G: sub-pixel, 11R: sub-pixel, 12: pixel array, 13: row driver, 14: column driver, 15: circuit, 16: selection circuit, 20: shift register, 21: buffer circuit, 22: shift register, 23: buffer circuit, 24: sensor, 25: circuit, 26B: electrode, 26G: electrode, 26R: electrode, 101: transistor, 102: transistor, 102a: transistor, 102b: transistor, 103: transistor, 104: capacitor, 110: circuit block, 111: transistor, 112: transistor, 113: capacitor, 114: EL element, 115: transistor, 116: capacitor, 117: liquid crystal element, 118: transistor, 119: transistor, 120: circuit, 121: wiring, 122: wiring, 123: wiring, 126: wiring, 128: wiring, 129: wiring, 130: wiring, 131: wiring, 132: wiring, 133: wiring, 134: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: display portion, 903: display portion, 904: sensor, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 4001: substrate, 4005: sealant, 4006: substrate, 4008: liquid crystal layer, 4010: transistor, 4011: transistor, 4013: liquid crystal element, 4014: wiring, 4015: electrode, 4017: electrode, 4018: FPC, 4019: anisotropic conductive layer, 4020: capacitor, 4021: electrode, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: partition wall, 4511: light-emitting layer, 4513: light-emitting element, 4514: filler.

This application is based on Japanese Patent Application Serial No. 2017-225270 filed with Japan Patent Office on Nov. 23, 2017, the entire contents of which are hereby incorporated by reference.

The invention claimed is:

1. A display device comprising:
a first transistor;
a second transistor;
a third transistor;
a first capacitor;
a circuit block;
a first wiring; and
a second wiring,
wherein the circuit block comprises a display element, a fourth transistor, and a second capacitor,
wherein one of a source and a drain of the first transistor is electrically connected to one of a source and a drain of the second transistor,
wherein the one of the source and the drain of the second transistor is electrically connected to a first electrode of the first capacitor,
wherein a second electrode of the first capacitor and one of a source and a drain of the third transistor are connected to a node,
wherein a potential of the node is supplied to the fourth transistor,
wherein the other of the source and the drain of the first transistor is electrically connected to the first wiring,
wherein the other of the source and the drain of the third transistor is electrically connected to the first wiring,
wherein a gate of the second transistor is electrically connected to the second wiring,
wherein a gate of the third transistor is electrically connected to the second wiring.

2. A display device comprising:
a first transistor;
a second transistor;
a first circuit;
a second circuit;
a first wiring; and
a second wiring,
wherein the first circuit and the second circuit each comprise a third transistor, a first capacitor, and a circuit block,
wherein the circuit block in each of the first circuit and the second circuit comprises a display element, a fourth transistor, and a second capacitor,
wherein one of a source and a drain of the first transistor is electrically connected to one of a source and a drain of the second transistor,
wherein a first electrode of the first capacitor in each of the first circuit and the second circuit is electrically connected to the one of the source and the drain of the first transistor,
wherein in each of the first circuit and the second circuit, a second electrode of the first capacitor and one of a source and a drain of the third transistor are connected to a node,
wherein in each of the first circuit and the second circuit, a potential of the node is supplied to the fourth transistor,
wherein the other of the source and the drain of the third transistor in the first circuit is electrically connected to the first wiring,
wherein the other of the source and the drain of the first transistor is electrically connected to the first wiring,
wherein a gate of the third transistor in the first circuit is electrically connected to the second wiring,
wherein a gate of the third transistor in the second circuit is electrically connected to the second wiring, and wherein a gate of the second transistor is electrically connected to the second wiring.

3. The display device according to claim 1,
wherein the display element is an organic EL element,
wherein a first electrode of the organic EL element is electrically connected to a first electrode of the second capacitor and one of a source and a drain of the fourth transistor, and
wherein a gate of the fourth transistor and a second electrode of the second capacitor are electrically connected to the node.

4. The display device according to claim 3, wherein the other of the source and the drain of the fourth transistor is electrically connected to the other of the source and the drain of the second transistor.

5. The display device according to claim 1,
wherein the display element is a liquid crystal element,
wherein a first electrode of the liquid crystal element is electrically connected to a first electrode of the second capacitor and one of a source and a drain of the fourth transistor, and
wherein the other of the source and the drain of the fourth transistor is electrically connected to the node.

6. The display device according to claim 5, wherein a second electrode of the second capacitor is electrically connected to the other of the source and the drain of the second transistor.

7. The display device according to claim 1, wherein the third transistor comprises a metal oxide in a channel formation region and the metal oxide comprises In, Zn, and M, M being selected from Al, Ti, Ga, Sn, Y, Zr, La, Ce, Nd, and Hf.

8. An electronic device comprising the display device according to claim 1 and a camera.

9. The display device according to claim 2,
wherein the display element is an organic EL element,
wherein in each of the first circuit and the second circuit, a first electrode of the organic EL element is electrically connected to a first electrode of the second capacitor and one of a source and a drain of the fourth transistor, and
wherein in each of the first circuit and the second circuit, a gate of the fourth transistor and a second electrode of the second capacitor are electrically connected to the node.

10. The display device according to claim 9, wherein the other of the source and the drain of the fourth transistor in each of the first circuit and the second circuit is electrically connected to the other of the source and the drain of the second transistor.

11. The display device according to claim 2,
wherein the display element is a liquid crystal element,
wherein in each of the first circuit and the second circuit, a first electrode of the liquid crystal element is electrically connected to a first electrode of the second capacitor and one of a source and a drain of the fourth transistor, and
wherein in each of the first circuit and the second circuit, the other of the source and the drain of the fourth transistor is electrically connected to the node.

12. The display device according to claim 11, wherein a second electrode of the second capacitor in each of the first circuit and the second circuit is electrically connected to the other of the source and the drain of the second transistor.

13. The display device according to claim 2, wherein the third transistor in each of the first circuit and the second circuit comprises a metal oxide in a channel formation region and the metal oxide comprises In, Zn, and M, M being selected from Al, Ti, Ga, Sn, Y, Zr, La, Ce, Nd, and Hf.

14. An electronic device comprising the display device according to claim 2 and a camera.

* * * * *